United States Patent
Araki et al.

(10) Patent No.: US 6,352,083 B1
(45) Date of Patent: Mar. 5, 2002

(54) SUBSTRATE TREATING APPARATUS AND SUBSTRATE TREATING METHOD

(75) Inventors: Hiroyuki Araki; Kenichiro Arai; Masaaki Yabuta, all of Shiga-ken (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/195,190

(22) Filed: Nov. 17, 1998

(30) Foreign Application Priority Data

Nov. 20, 1997 (JP) .............................. 9-319660
Sep. 17, 1998 (JP) ........................... 10-263616

(51) Int. Cl.$^7$ .......................... B08B 3/00; H01L 21/302
(52) U.S. Cl. .................. 134/56 R; 134/94.1; 134/95.2; 134/95.3; 414/225
(58) Field of Search .................. 414/225; 134/56 R, 134/94.1, 95.3, 102.3; 216/83; 438/745

(56) References Cited

U.S. PATENT DOCUMENTS 3,871,914 A * 3/1975 Goffredo et al. ............ 134/109
5,996,241 A * 12/1999 Thompson et al. ............. 34/58
6,004,399 A * 12/1999 Wong et al. .................... 134/2

* cited by examiner

Primary Examiner—George Goudreau
(74) Attorney, Agent, or Firm—Ostrolenk, Faber, Gerb & Soffen, LLP

(57) ABSTRACT

A control unit controls a lifter to raise at least part of each of a group of substrates above the liquid level of a treating liquid in a treating bath. Thereafter, a valve is opened to drain the treating liquid from the treating bath at a high speed. As a result, a physical force to tilt and adhere an upper portion of the adjacent substrates accompanied by lowering of the liquid level of the treating liquid due to the high speed drainage acts upon a lower portion of the substrates near the lowered liquid level of the treating liquid, thereby reducing the physical force exerted on the substrates. This arrangement, even if a holding interval between the substrates is narrowed at a half of a normal pitch, eliminates a contact of the adjacent substrates and prevents damage of the substrates due to the contact without providing an additional member such as a substrate support guide in the treating bath.

19 Claims, 13 Drawing Sheets

FIG. 6A
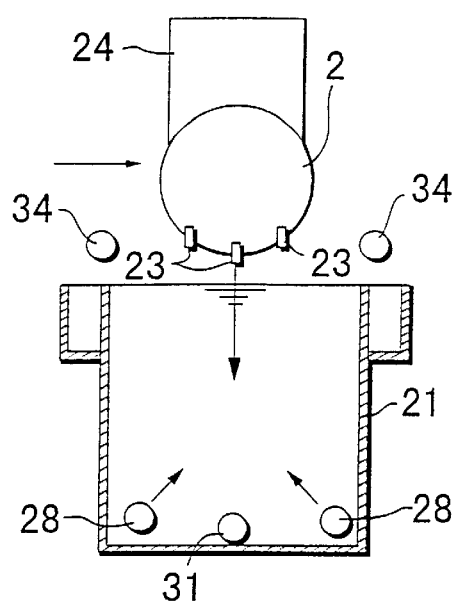
FIG. 6B
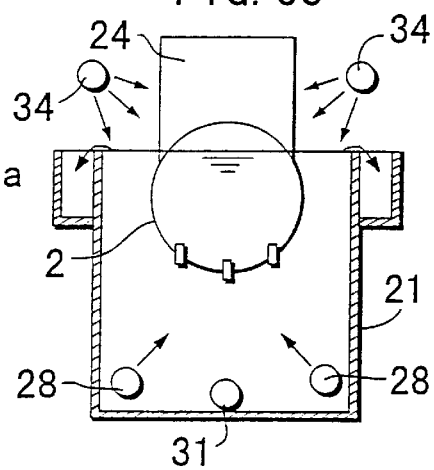
FIG. 6C
FIG. 6D
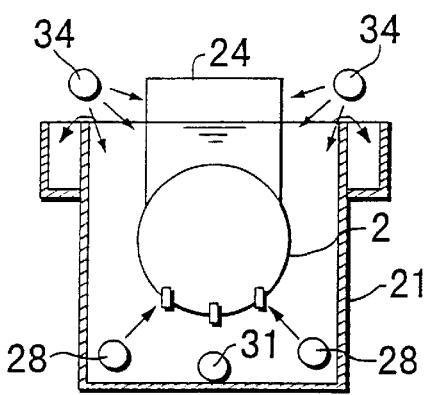
FIG. 6E

VALVE MEMBER 30

VALVE MEMBER 36

VALVE MEMBER 33a

VALVE MEMBER 33b

SUBSTRATE TREATING APPARATUS AND SUBSTRATE TREATING METHOD

BACKGROUND OF THE INVENTION

1. Field of the Invention

This invention relates to a substrate treating apparatus and a substrate treating method in which a substrate having a very small thickness such as a semiconductor substrate and a glass substrate for use in a liquid crystal display panel (hereinafter, merely referred to as a "substrate") is immersed in a treating liquid such as a chemical liquid and de-ionized water (or refined water) filled in a treating bath to apply a certain treatment onto the substrate.

2. Description of the Background Art

There have conventionally been conducted various surface treatments in which a substrate is immersed in a treating liquid in a process of producing a substrate for use in a precision electronic device. One of known substrate treating apparatus comprises a chemical bath filled with a chemical liquid such as etchant and photoresist film peeling liquid and a water bath filled with de-ionized water (or refined water).

More specifically, after a substrate is immersed in a chemical liquid in the chemical bath to apply a chemical treatment onto the substrate, then, the substrate is immersed in de-ionized water in the water bath to wash away the chemical liquid adhered to the substrate and particles generated and adhered to the substrate during the chemical treatment.

One method of washing off the chemical liquid and the particles is a mechanical rinsing treatment according to which the chemical liquid and the particles are quickly rinsed off. Hereafter, the mechanical rinsing treatment is described with reference to FIGS. 1A to 2.

FIGS. 1A to 1E are diagrams showing a sequence of the mechanical rinsing treatment in a mechanical rinsing section of the conventional substrate treating apparatus. Specifically, FIG. 1A shows a state that a substrate applied with a chemical liquid has been transported to the mechanical rinsing section and is about to be immersed in de-ionized water in the water bath. FIG. 1B shows a state that the substrate has been immersed in the de-ionized water in the water bath, and the water bath is resultantly brought to an overflow state. FIG. 1C shows a state that a high speed drainage is performed spontaneously with actuation of a shower. FIG. 1D shows a state that the high speed drainage is suspended and the water bath is being replenished with de-ionized water with continuation of the shower. FIG. 1E shows a state that the water bath is brought to an overflow state again.

As shown in FIG. 1A, a group of semiconductor substrates 53 (hereinafter, merely referred to as "a substrate group" and in FIGS. 1A to 1E, only one substrate is shown) held by a transport robot (not shown) is transferred from a chemical bath 52 to a water bath 51 and handed to a lifter 55 provided in a mechanical rinsing section 50. When the substrate group is handed to the lifter 55, the substrate group is held by a three-point support guide 54 at lower portions thereof in a state that all the substrates are held in an upright posture at a specified interval (e.g., normal pitch P=6.00 mm or half pitch P/2). In this state, the substrate group is immersed together with the support guide 54 in de-ionized water filled in the water bath 51 (see FIG. 1B).

At this stage, de-ionized water is continued to be replenished through water supply portions 56 provided at opposite ends of a bottom portion of the water bath 51. When the substrate group is immersed with the support guide 54 in the water bath 51 with the continued replenishment of de-ionized water, the de-ionized water in the water bath 51 overflows from an upper rim 51a of the water bath 51. Thus, the chemical liquid adhered to the substrate group and particles generated and adhered to the substrate group during the chemical treatment are washed away together with the overflowing water from the water bath 51.

After continuation of the overflow state for a predetermined time, as shown in FIG. 1C, replenishment of de-ionized water through the water supply portions 56 is temporarily suspended in the case that the surface of the substrate group exhibits a hydrophillic state. Simultaneously, a drainage valve 57 provided at a lower portion of a side wall of the water bath 51 is opened to drain the de-ionized water mixed with the chemical liquid and the particles from the water bath 51 at a high speed. At the same time as the opening of the drainage valve 57 or after a duration of a certain time (before the substrate group is being exposed to the air owning to the high speed drainage), a nozzle (not shown) of each of shower pipes 58 provided opposingly above the upper rim 51a is operated to shower de-ionized water onto an upper portion of the surface of the substrate group. In this way, the surface of the substrate group is prevented from being exposed to the air, thereby suppressing deposition of an oxide film on the surface of the substrate group, which might have caused naturally due to exposure to the air.

Upon completion of the high speed drainage in a state that the shower of de-ionized water through the nozzles of the shower pipes 58 is continued, as shown in FIG. 1D, the drainage valve 57 is closed, and replenishment of de-ionized water through the water supply portions 56 starts. Thereby, the water bath 51 is filled with de-ionized water again, and thus, water replacement in the water bath 51 is performed.

The replenishment of de-ionized water through the water supply portions 56 is continued (see FIG. 1D). Consequently, as shown in FIG. 1E, the de-ionized water in the water bath 51 overflows from the upper rim 51a of the water bath 51 again to wash off the chemical liquid and the particles adhered to the substrate group 53 along with the overflowing water.

The above sequence is executed in accordance with the timing shown in FIG. 2. Specifically, as shown in FIG. 2, the following operations are executed at timings T1, T2, T3.

T1: Suspend supply of de-ionized water through the water supply portions 56;

Start shower of de-ionized water through the nozzles of the shower pipes 58; and high speed drainage starts by opening the drainage valve 57.

T2: Start replenishment of de-ionized water through the water supply portions 56; and Suspend the high speed drainage by closing the drainage valve 57 (at this time, the shower continues).

T3: Suspend shower (at this time, the replenishment of purified water through the water supply portions 56 continues, and the drainage valve 57 is kept closed).

The above sequence is cyclically repeated for a predetermined number of times. Thus, the chemical liquid and the particles adhered to the substrate group are removed therefrom.

The conventional arrangement of holding the substrate group by the lifter 55 has suffered from the following problem. As shown in FIG. 3A, each substrate 53 is supported in each of support grooves 54a formed in the support guide 54. Specifically, lower ends 53a of the substrates 53 are detachably fitted in the support grooves 54a of the support guide 54 at a specified interval, thereby restricting a movement of the lower portions of the substrates 53. Thereby, the substrate group is supported in an upright posture at three lower portions thereof by the support guide 54. However, an upper portion of the substrates 53 is set free without any support. Accordingly, what happens at the high speed drainage is an undesired contact of the adjacent substrates 53 as shown in FIG. 3B due to a turbulence of the water flow in the water bath 51.

More specifically, at the start of the high speed drainage, accompanied with a drastic lowering of water surface 61 (or liquid level 61 in FIG. 3B) of the de-ionized water in the water bath 51 along with a gush of the de-ionized water drawn out through the drainage valve 57, a turbulence or a swirling occurs in the de-ionized water in the water bath 51. Thereby, the upper portion of the adjacent substrates 53 is tilted to each other about the support portion 53a fitted in the support groove 54a, as shown in FIG. 3B, and the upper portion of the surface of the adjacent substrates 53 comes into contact to each other.

In particular, when the surface of the substrate 53 exhibits a hydrophillic state, it is highly likely that the substrates 53 may come into contact in a state that water on the surface of the substrates 53 remains in between. Accordingly, it may be difficult to detach the adjacent substrates 53 in contact, and a forcible detachment of the substrates 53 may result in a damage or a breakage of the substrate(s) 53. In addition, the undesired contact of the substrates 53 may generate particles and transmit the particles adhered on one substrate to the adjacent substrate in contact. The last problem is significant particularly in the case where the substrate group is held at a small interval (e.g., half pitch P/2).

There is proposed an idea to avoid the above undesired contact of the substrates 53 that the support groove 54a of the support guide 54 is formed into a V-shape with an attempt to securely hold the lower part 53a of the substrates 53. In this case, however, the secured retaining of the lower part 53a of the substrates 53 impairs flexibility of the substrate itself, although the upper part of the substrates 53 is set free. Specifically, when a turbulence or a swirling happens in the water flow accompanied with a drastic lowering of the liquid level 61 due to a high speed drainage in a state that the lower part 53a of the substrates 53 is trapped in the V-shaped support groove, the free upper portion of the substrates 53 is strongly pushed into each other, and the entirety of the substrate 53 is tilted to each other about the tightly held lower part 53a in the V-shaped groove. As a result, there may be a high possibility of a crack in the substrate 53, and in a worse case, a breakage of the substrate 53.

There is proposed another idea of providing a support guide formed with grooves in the water bath 51 to securely hold a substrate group in the water bath 51, thus preventing tilting and adhesion of the substrates 53. However, this idea requires extra support guide, which would become an additional element in the water bath 51. Further, positioning the support guide 54 relative to the fixed support guide in the water bath 51 is difficult. Also, the fixed support guide in the water bath 51 obstructs smooth water flow in the water bath 51, thereby deterring water replacement in the water bath 51.

SUMMARY OF THE INVENTION

In view of the above, it is an object of the invention to solve the above drawbacks residing in the prior art.

It is another object of the invention to provide a substrate treating apparatus and a substrate treating method capable of preventing tilting and adhesion of adjacent substrates during a high speed drainage to prevent damage of the substrates, generation of particles, and adhesion of the particles to the substrates without providing an additional support guide formed with grooves.

In order to fulfill the above objects, a substrate treating apparatus, according to an aspect of this invention, in which substrates are immersed in a treating liquid filled in a treating bath to apply a certain treatment to the substrates comprises a drainage system for draining the treating liquid from the treating bath; and a controller for setting a relative positional relationship between the substrates and the liquid level of the treating liquid to expose part of the substrates above the liquid level of the treating liquid prior to a high speed drainage by the drainage system.

According to-another aspect of this invention, this invention relates to a substrate treating method comprising the steps in the order of: a treating process of applying a certain treatment to substrates by immersing the entirety of the substrates in a treating liquid filled in a treating bath; a position adjusting process of setting a relative positional relationship between the substrates and the liquid level of the treating liquid to expose part of the substrates above the liquid level of the treating liquid; and a high speed draining process of draining the treating liquid from the treating bath at a high speed.

The above and other objects, features and advantages of the present invention will become more apparent upon reading of the following detailed description and drawings.

BRIEF DESCRIPTION OF THE DRAWINGS

FIGS. 6A to 6E are diagrams showing a sequence of operations in the first mechanical rinsing section;

DETAILED DESCRIPTION OF THE PREFERRED EMBODIMENTS OF THE INVENTION

First, briefly described is a construction of a wet station incorporated with a mechanical rinsing section embodying a substrate treating apparatus according to this invention. Then, various embodiments and modifications of the mechanical rinsing section are described.

[Wet Station]

Figure 1A:
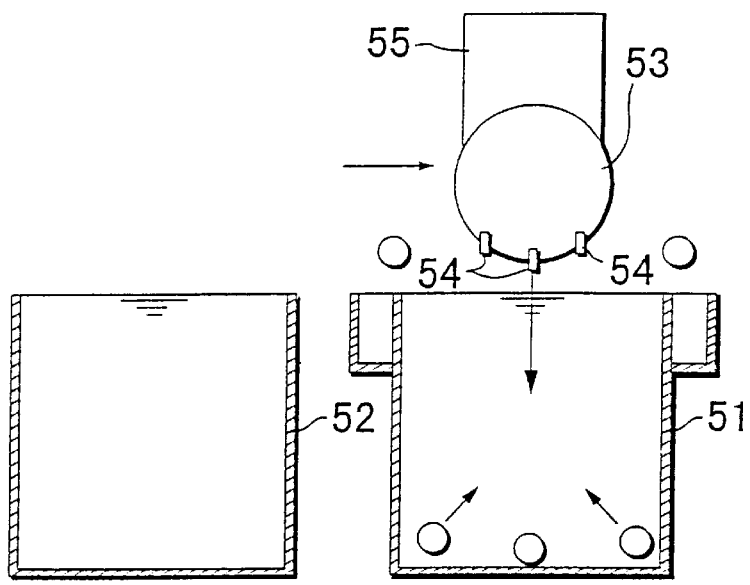
FIGS. 1A to 1E are schematic diagrams showing a sequence of mechanical rinsing operations by a conventional mechanical rinsing section.
Figure 1B:
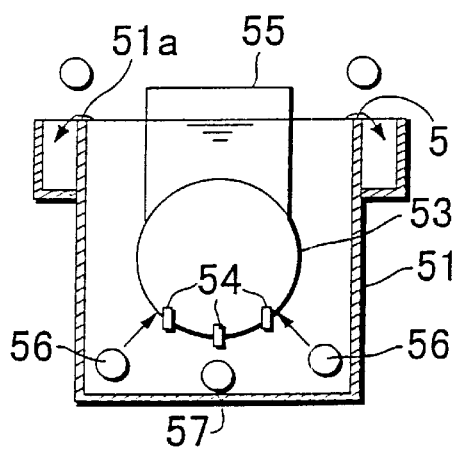
Figure 1C:
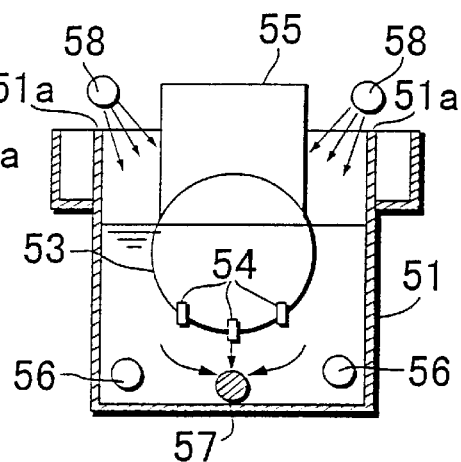
Figure 1D:
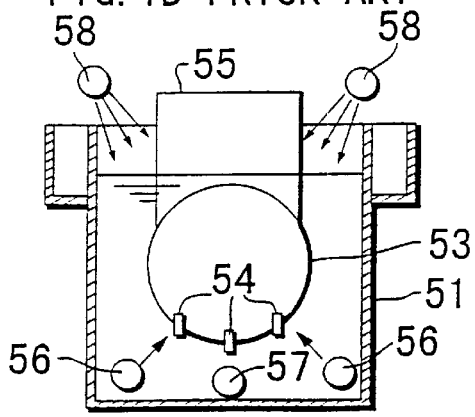
Figure 1E:
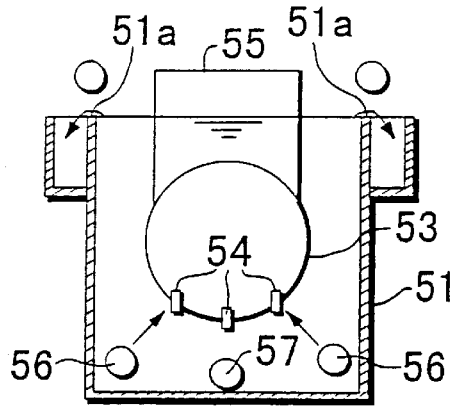
Figure 2:
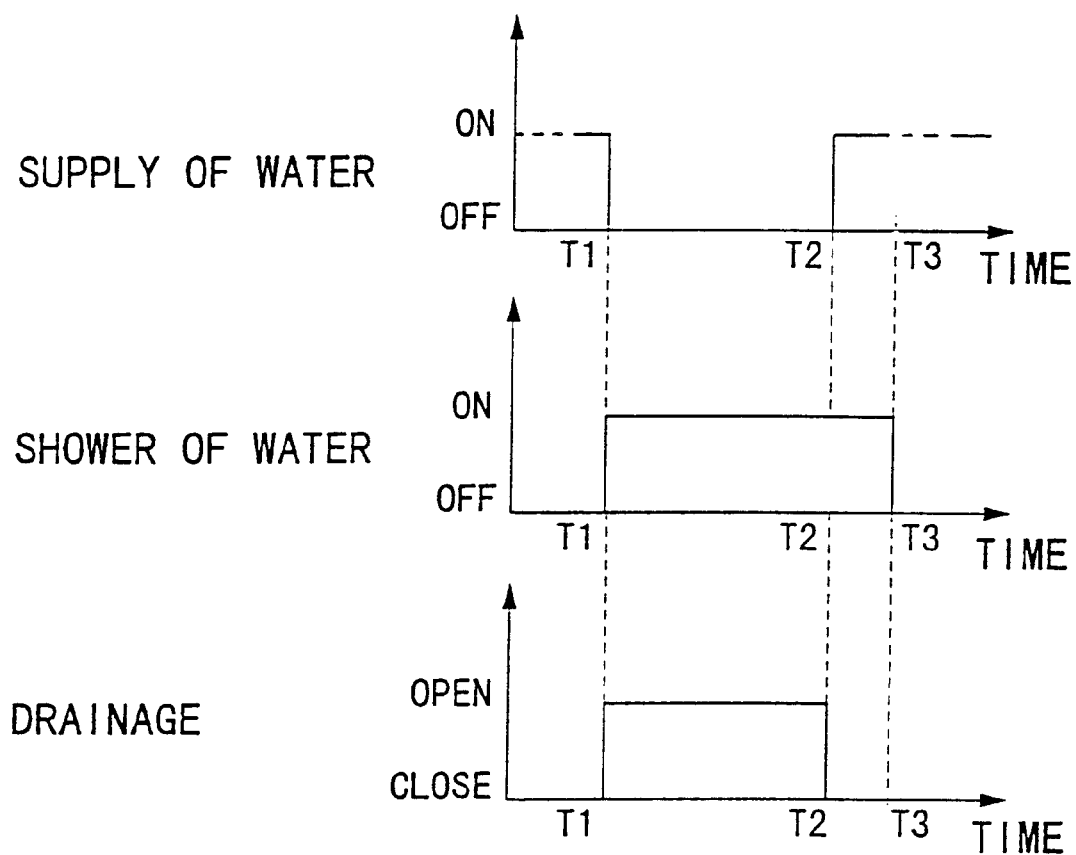
FIG. 2 is a timing chart showing the operations of the conventional mechanical rinsing section.
Figure 3A:
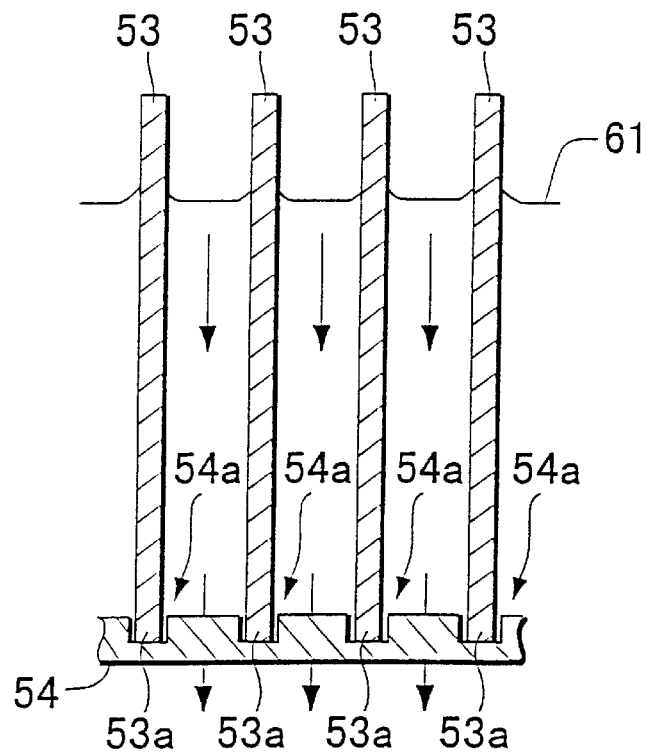
FIGS. 3A and 3B are schematic diagrams respectively showing a state that substrates are held in an upright posture in de-ionized water in a water bath of the conventional mechanical rinsing section prior to a high speed drainage and a state that the substrates are tilted and adhered to each other due to the high speed drainage.
Figure 3B:
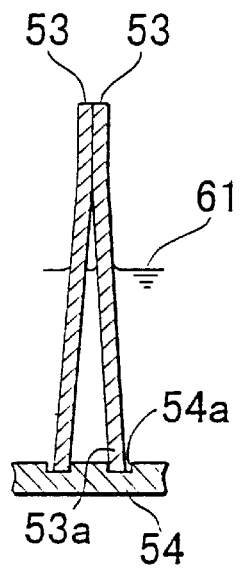
Figure 4:
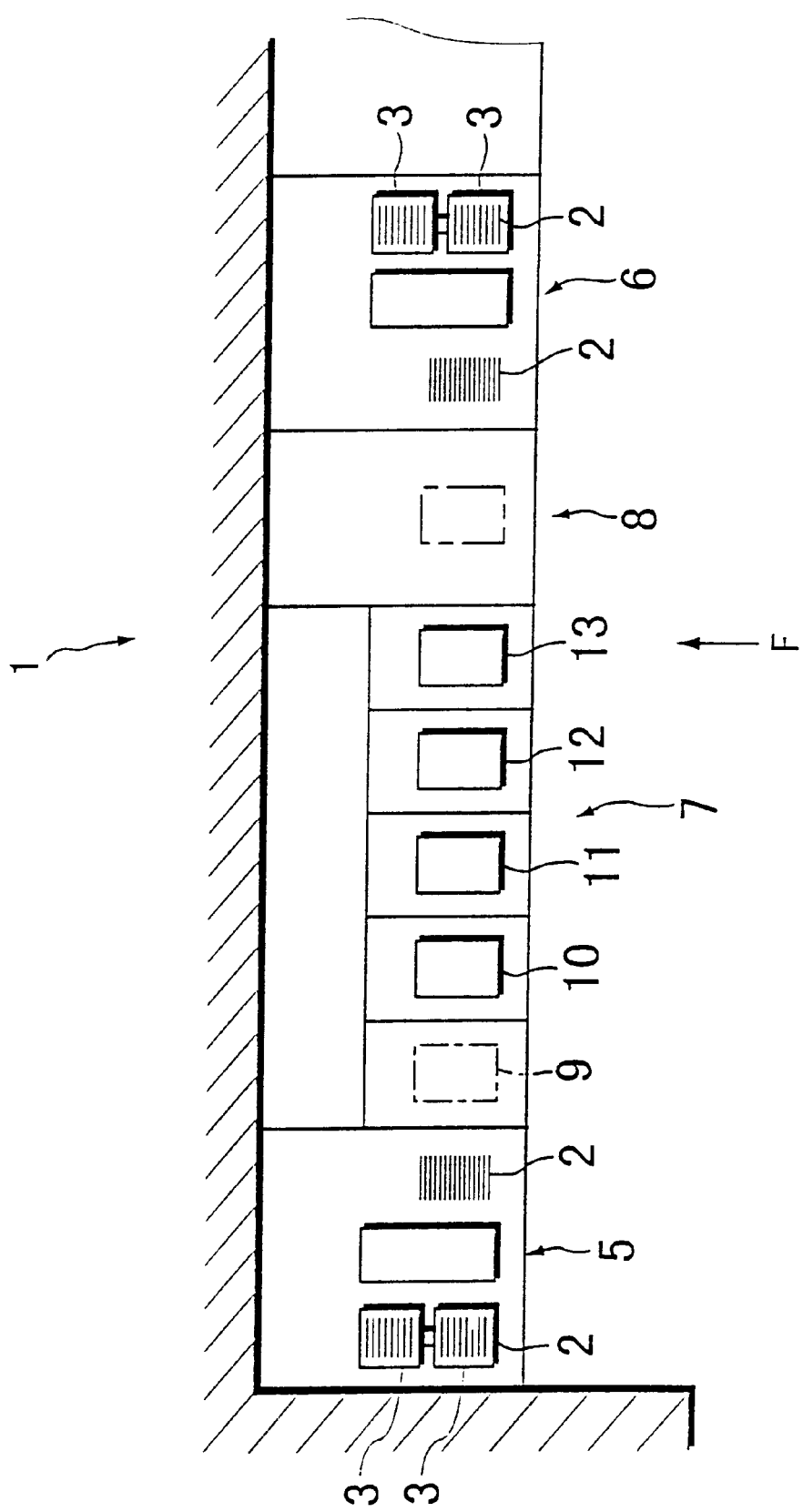
FIG. 4 is a plan view showing a schematic construction of a wet station incorporated with a mechanical rinsing section embodying a substrate treating apparatus according to this invention.

FIG. 4 is a plan view showing a schematic construction of a wet station 1 incorporated with the substrate treating apparatus according to this invention. It should be noted that a front side of the wet station 1 is a side viewed from a direction shown by the arrow F in FIG. 4.

A processing unit 7 of the wet station 1 comprises a hand cleansing section 9, a first phosphoric acid treating section 10, a second phosphoric acid treating section 11, a mechanical rinsing section 12, a final rinsing section 13 from left to right in the order of processing in FIG. 4.

More specifically, in the hand cleansing section 9, cleansed is a hand of a transport robot (not shown) which transfers a plurality of substrates 2 (substrate group 2) to each section. The first phosphoric acid treating section 10 includes a chemical bath filled with a solution of phosphoric acid adapted for removing a nitride film from the surface of the substrate group 2. When the substrate group 2 is immersed in the chemical bath, the substrate group 2 is applied with a chemical treatment. Similar to the first phosphoric acid treating section 10, the second phosphoric acid treating section 11 includes a chemical bath filled with a solution of phosphoric acid adapted for removing a nitride film from the surface of the substrate group 2. When the substrate group 2 is immersed in the chemical bath of the second phosphoric acid treating section 11, the substrate group 2 is applied with a chemical treatment. The mechanical rinsing section 12 is an example of the substrate treating apparatus according to this invention, and is adapted for rinsing off the phosphoric acid and the particles adhered to the substrate group 2. The final rinsing section 13 is adapted for completely rinsing off the phosphoric acid and the particles adhered to the substrate group 2 at a final stage.

A reason for providing the two phosphoric acid treating sections 10 and 11 is that the nitride film removal process with the use of the solution of phosphoric acid takes a longer time compared with other processes. Providing the sections 10 and 11 and proceeding the nitride film removal process simultaneously in the sections 10 and 11 shorten a processing tact.

A reason for providing the mechanical rinsing section 12 is as follows. If the phosphoric acid adhered to the substrate group 2 by the chemical treatment in the treating section 10 (11) remains, the nitride film removal process progresses as time lapses. The mechanical arrangement in which a high speed drainage is performed immediately after the substrate group 2 is immersed in de-ionized water in a water bath of the mechanical rinsing section 12 followed by replenishment of de-ionized water accelerates water replacement and helps lowering the concentration of the phosphoric acid solution relative to the de-ionized water in the water bath despite the fact that the phosphoric acid comes out of the substrate group 2. In this way, progress of the nitride film removal is prevented.

[First Embodiment]

A first embodiment of this invention is described with reference to FIGS. 5 to 7.

Figure 5:
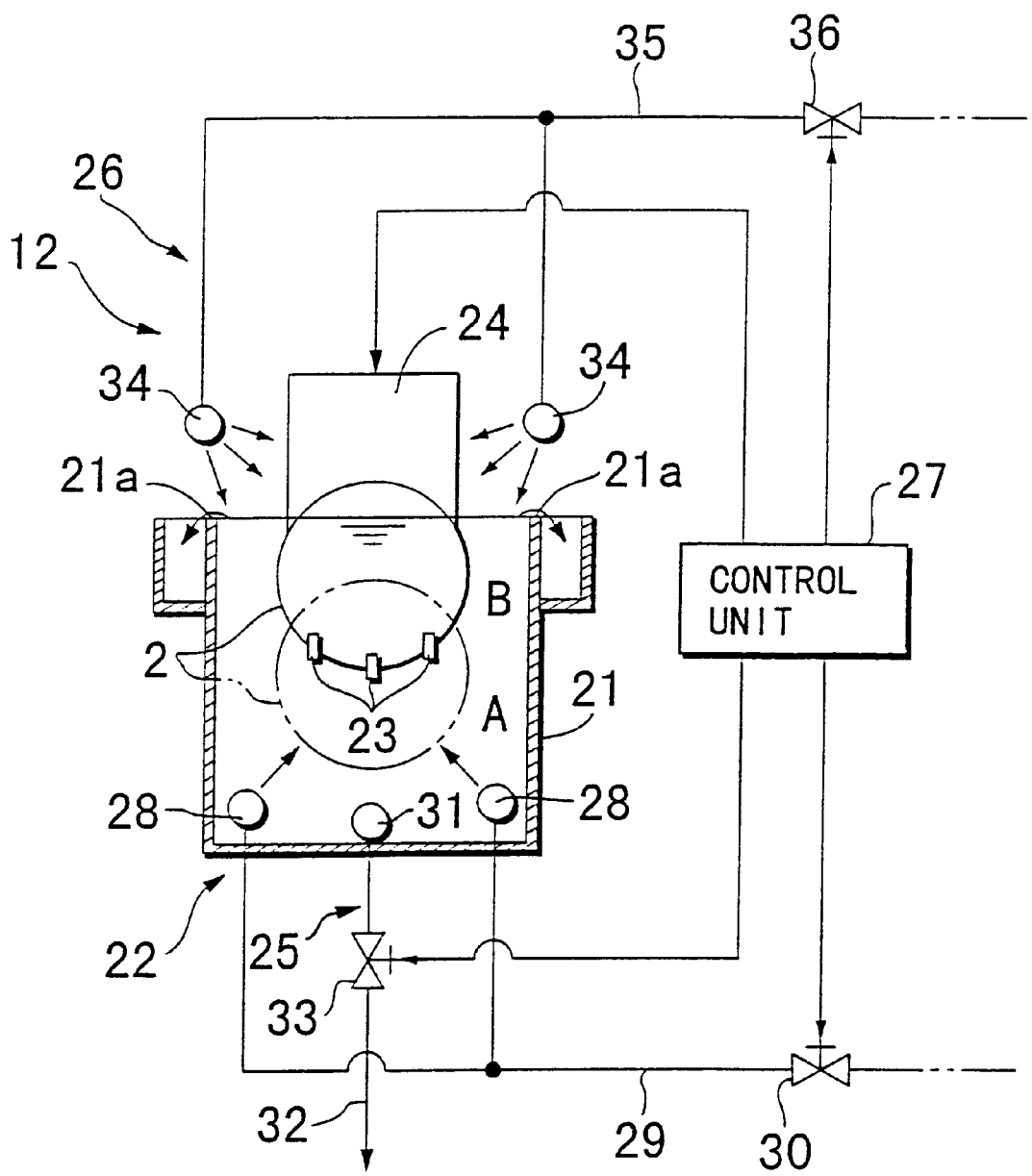
FIG. 5 is a schematic diagram showing a construction of the mechanical rinsing section as a first embodiment.

FIG. 5 is a diagram showing a schematic construction of the mechanical rinsing section as a first embodiment. In FIG. 5, the mechanical rinsing section 12 comprises a water bath 21, a de-ionized water supply unit 22, a lifter 24, a drainage system 25, a shower unit 26, and a control unit 27 (controller 27). The water bath 21 is a treating bath opened upward to allow the substrate group 2 to be immersed from upward in de-ionized water (or treating liquid) filled therein. The water supply unit 22 supplies de-ionized water to the water bath 21 to overflow the water. The lifter 24 is an elevating mechanism adapted for immersing the substrate group 2 in an upright posture in the de-ionized water in the water bath 21. The drainage system 25 drains a processed liquid from the water bath 21 (in this embodiment, a solution mixed with de-ionized water and phosphoric acid) at a high speed. The processed liquid is the solution in the water bath 21 produced after the substrate group 2 applied with the phosphoric acid treatment in the treating section 10 or 11 is immersed in the de-ionized water in the water bath 21. The shower unit 26 is adapted to shower de-ionized water onto an upper portion on the surface of the substrate group 2. The control unit 27 controls the drainage system 25 to drain the processed liquid from the water bath 21, and also controls the lifter 24 to set the substrate group 2 at such a position as to expose part of the upper portion of the substrate group 2 above the water level (liquid level) of the de-ionized water in the water bath 21 prior to the drainage by the drainage system 25.

The water supply unit 22 includes a pair of tubular members 28, a plumbing member 29, and a valve member 30. The tubular members 28 are opposingly arranged at a bottom portion of the water bath 21 and have plural nozzles (not shown) toward the substrate group 2 immersed in the de-ionized water in the water bath 21 to eject de-ionized water. The plumbing member 29 is connected to the tubular members 28 to draw de-ionized water in the water bath 21. The valve member 30 is arranged on the way of the plumbing member 29 for fluid rate adjustment. When the valve member 30 is opened, de-ionized water is supplied to the water bath 21 via the plumbing member 29 and the nozzles of the tubular members 28. Continuation of the water supply overflows the de-ionized water from an upper rim 21a of the water bath 21 to wash away the chemical liquid and the particles adhered to the surface of the substrate group 2 together with the overflowing water.

The lifter 24 is so constructed as to move up and down the substrate group 2 between a lower position A (or adequate immerse position) shown by the phantom line in FIG. 5 and an intermediate position B (or drainage position) shown by the solid line in FIG. 5 in a state that each substrate of the substrate group 2 is fittingly supported in each groove of a three-point support guide 23 at three lower portions thereof at a predetermined pitch (half pitch $P/2$). When the substrate group 2 is set at the lower position A, the substrate group 2 is immersed in the deionized water in the water bath 21. On the other hand, when the substrate group 2 is set at the intermediate position B, part of the upper portion of the substrate group 2 is exposed above the liquid level of the de-ionized water in the water bath 21, and the drainage starts.

The drainage system 25 includes a drainage port 31, a plumbing member 32, and a valve member 33. The drainage port 31 is formed in a lowermost portion of a side wall of the water bath 21 opposing to the surface of the substrate group 2 when the substrate group 2 is immersed at the lower position A. The plumbing member 32 is connected to the drainage port 31 for drawing out the processed liquid from the water bath 21. The valve member 33 is arranged on the way of the plumbing member 32 for fluid rate adjustment.

When the valve member 33 is opened for a high speed drainage, the processed liquid in the water bath 21 is drained in a short time. When the valve member 33 is closed, the substrate group 2 is enabled to be immersed in sufficient de-ionized water, and the de-ionized water overflows to allow the chemical liquid and the particles adhered to the substrate group 2 to-be washed away of the water bath 21.

The shower unit 26 includes a pair of tubular members 34, a plumbing member 35, and a valve member 36. The tubular members 34 are opposingly arranged above the upper rim 21a of the water bath 21 and have plural nozzles (not shown) oriented obliquely downward for ejecting de-ionized water. The plumbing member 35 is connected to the tubular members 34 for drawing de-ionized water in the water bath 21. The valve member 36 is arranged on the way of the plumbing member 35 for fluid rate adjustment. When de-ionized water is showered onto the upper portion of the surface of the substrate group 2 through the nozzles of the tubular members 34, the surface of the substrate group 2 is prevented from continuous exposure to the air to suppress deposition of an oxide film on the surface of the substrate group 2, which might have developed naturally due to continuous exposure to the air.

The control unit 27 includes a sequencer and a microcomputer. The control unit 27 controls opening and closing of the valve members 30, 33, 36 in response to a control signal from the sequencer and the microcomputer, and controls a lift drive mechanism (not shown) of the lifter 24 to move the lifter 24 up and down so as to selectively set the substrate group 2 at the intermediate position B and the lower position A. When the substrate group 2 is lifted up at the intermediate position B to expose part of the upper portion of the substrate group 2 above the liquid level of the de-ionized water in the water bath 21, the control unit 27 controls the drainage system 25 to drain the processed liquid from the water bath 21 at a high speed.

More specifically, the control unit 27 is electrically connected to the lift drive mechanism of the lifter 24 and an electromagnetic valve control terminal of the valve member 36 to respectively lift the substrate group 2 with the lifter 24 from the lower immerse position A to the intermediate drainage position B and allow the shower unit 26 to shower de-ionized water onto the substrate group 2.

Also, the control unit 27 is connected to respective electromagnetic valve control terminals of the valve members 30, 33 to close the valve member 30 so as to suspend supply of de-ionized water and open the valve member 33 so as to perform a high speed drainage after the substrate group 2 is set at the intermediate position B.

Next, described is an operation of the wet station 1 having the above construction. The wet station 1 is installed in a clean room. An operator sets each carrier 3, from the front side of the wet station 1 in FIG. 4, onto a first table in a substrate transfer section 5 located on the substrate inlet side. Then, when the operator actuates a switch, the wet station 1 is operated to allow a substrate group 2 accommodated in each of the carriers 3 to be transferred to a transport robot (not shown).

Then, the substrate group 2 is transferred to the lifter 24 by a hand of the transport robot, and is transferred to each section (the first phosphoric acid treating section 10 (or the second phosphoric acid treating section 11), the mechanical rinsing section 12, and the final rinsing section 13) of the processing unit 7 by the lifter 24 in a sequential order to be immersed in the bath of the corresponding section.

More specifically, the following operation is performed in the mechanical rinsing section 12. FIGS. 6A to 6E are schematic diagrams showing a sequence of the operations in the mechanical rinsing section 12. FIG. 6A shows a state that a substrate group 2 applied with a chemical liquid is about to be immersed in the de-ionized water in the water bath 21. FIG. 6B shows a state that the substrate group 2 has been immersed in the de-ionized water in the water bath 21, and the water bath 21 is resultantly brought to an overflow state. FIG. 6C shows a state that the lifter 24 is operated with actuation of a shower. FIG. 6D shows a state that a high speed drainage starts with continuation of the shower. FIG. 6E shows a state that the water bath 21 is brought to an overflow state again.

The substrate group 2 having been applied with the chemical treatment in the second phosphoric acid treating section 11 (or the first phosphoric acid treating section 10) is transferred to the mechanical rinsing section 12 by the transport robot (not shown) and held by the lifter 24. Subsequently, as shown in FIG. 6A, the lifter 24 carrying the substrate group 2 in a state that each substrate is supported at the three lower portions thereof in an upright posture in the groove of the support guide 23 at a specified interval is immersed in the de-ionized water in the water bath 21. Then, the control unit 27 controls the electromagnetic valve control terminal of the valve member 30 to open the valve member 30 and controls the electromagnetic valve control terminal of the valve member 33 to keep closing the valve member 33. As shown in FIG. 6B, upon opening of the valve member 30, de-ionized water is replenished in the water bath 21 through the nozzles (not shown) of the tubular members 28 of the water supply unit 22 in such a manner that the water is ejected toward the substrate group 2 set at the lower position A. As a result, the de-ionized water overflows from the upper rim 21a of the water bath 21 to wash away the chemical liquid and the particles adhered to the surface of the substrate group 2 during the chemical treatment from the water bath 21 along with the de-ionized water (treating process).

The control unit 27 keeps opening the valve member 30 and closing the valve member 33 for a predetermined time to continue overflow of the de-ionized water from the water bath 21. Thereafter, in the case where the surface of the substrate group 2 exhibits a hydrophillic state, the control unit 27 controls the lift drive mechanism to move the lifter 24 upward to the predetermined intermediate position B and controls the electromagnetic valve control terminal of the valve member 36 to open the valve member 36. Then, as shown in FIG. 6C. part of the upper portion of the substrate group 2 carried by the lifter 24 is exposed above the liquid level of the de-ionized water in the water bath 21. At this time, de-ionized water is showered onto the upper portion of the surface of the substrate group 2 through the nozzles (not shown) of the tubular members 34 of the shower unit 26. Thereby, the surface of the substrate group 2 is prevented from being exposed to the air.

Figure 7:
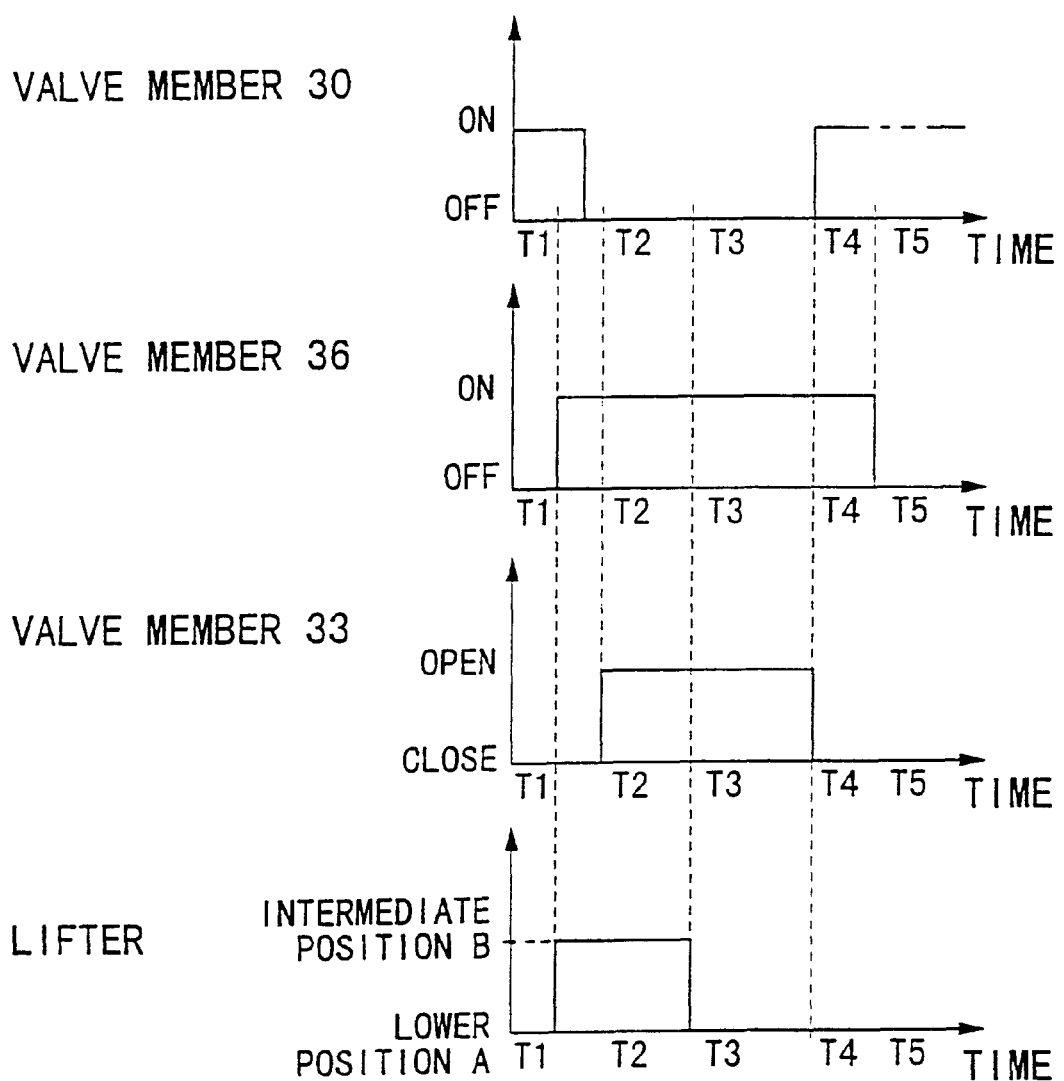
FIG. 7 is a timing chart of the operations of the first mechanical rinsing section.

The control unit 27 controls the valve members 30, 33, 36 at the timing shown in FIG. 7. Specifically, at the timing T1, while the valve member 33 that enables a high speed drainage of the processed liquid through the drainage port 31 is kept at a closed state, the valve member 30 is set to an opened state to supply de-ionized water through the nozzles of the tubular members 28. In this way, according to the first embodiment, controlling the lifter 24 sets a positional relationship of the substrate group 2 relative to the liquid level of the de-ionized water in the water bath 21 (position adjusting process).

In this embodiment, part of the upper portion of the substrate group 2 is exposed above the liquid level of the de-ionized water in the water bath 21 when the substrate group 2 is set at the upper position B. Specifically, when the substrate group 2 is set at the upper position B in the case that the substrate of 200 mm diameter is used, 40 mm of the upper portion of the substrate is exposed outside the liquid level (exposure ratio 20% relative to the diameter). Setting the exposure ratio as above eliminated tilting and adhesion of the substrates accompanied by lowering of the liquid level due to a high speed drainage and prevented a damage of the surface of the substrates.

It should be noted that the more the exposure ratio is, the better a damage of substrates due to a high speed drainage can be prevented. In other words, lowering the liquid level relative to the substrate group 2 (i.e., raising the substrate group 2 relative to the liquid level) during the high speed drainage securely reduces a possibility of tilting and adhesion of the substrates. Such desirable condition can be obtained by elevating the lifter 24 upward. Accordingly, the exposure ratio of the substrate group 2 is determined, based on an experiment, in such a manner that the adjacent substrates are prevented from being tilted and resultantly adhered to each other due to a high speed drainage, depending on the distance between the surfaces of the adjacent substrates (pitch of the arrayed substrates), the material and the thickness of the substrate, and the state held by the lifter 24.

After setting the substrate group 2 at the upper position B and starting a shower by the shower unit 26, the control unit 27, as shown in FIG. 6D, controls the electromagnetic valve control terminal of the valve member 30 to close the valve member 30 to suspend supply of de-ionized water. Subsequently, at the timing T2, (see FIG. 7) the valve member 33 is opened to perform a high speed drainage of the processed liquid from the water bath 21 through the drainage port 31 (high speed draining process).

Then, at the timing T3, the control unit 27 controls the lift drive mechanism to lower the lifter 24 carrying the substrate group 2 to the predetermined lower position A (adequate immerse position). Alternatively, the lifter 24 may be gradually lowered together with the substrate group 2 in accordance with lowering of the liquid level during the high speed drainage in such a manner as to lessen a physical load exerted to the substrate group 2 due to the turbulence of water flow as a result of the high speed drainage.

At the timing T4 when the high speed drainage is completed, the control unit 27 controls the electromagnetic valve control terminal of the valve member 30 to open the valve member 30 to replenish de-ionized water in the water bath 21. Meanwhile, the shower of de-ionized water onto the substrate group 2 by the shower unit 26 is continued until the timing T5 to help recover the liquid level to such a level as to immerse at least the substrate group 2 in the de-ionized water in the water bath 21. Thereby, as shown in FIG. 6E, de-ionized water is continued to be supplied through the nozzles of the tubular members 28 of the shower unit 22 to allow the de-ionized water to overflow from the upper rim 21a of the water bath 21 so as to wash away the chemical liquid and the particles adhered to the surface of the substrate group 2 together with the overflowing water.

Thereafter, the control unit 27 controls the valve members 30, 33, 36 and the lifter 24 to repeat the above sequence again. Specifically, lifting of the substrate group 2 to the intermediate position B and actuation of the shower unit 26 (see FIG. 6C), high speed drainage (see FIG. 6D), and immersing of the substrate group 2 to allow the water bath 21 to an overflow state (see FIG. 6E) are cyclically repeated for a predetermined number of times. Thereby, the chemical liquid and the particles adhered to the surface of the substrate group 2 are quickly removed, and thus the mechanical rinsing operation in the mechanical rinsing section 12 to prevent an adverse affect of the chemical liquid and the particles adhered to the substrates is finalized.

Thereafter, the substrate group 2 is rinsed in the final rinsing section 13, and subject to a spin dry in a dryer 8. Then, the substrate group 2 is transferred to a substrate transfer section 6 located on the substrate outlet side by a transport robot (not shown). Opposite to the operation in the substrate transfer section 5, the substrates that have been subject to a certain treatment in the processing unit 7 (processed substrates) are distributed to two carriers 3 set side by side in the substrate transfer section 6 to allow two groups of processed substrates to be accommodated in the carriers 3. Then, the operator carries away the two carries 3 in which the processed substrates are accommodated.

As mentioned above, each substrate of the substrate group 2 is supported by the support guide 23 in a fitted state in the groove. As described in the Prior Art section, it is highly likely that the upper portion of the substrates is tilted and resultantly adhered to each other accompanied by a drastic lowering of the liquid level during a high speed drainage of the processed liquid. In other words, the upper portion of the substrates is subject to an influence of a change of water flow and resultantly may be tilted and adhered to each other.

However, in this embodiment, the control unit 27 controls the lifter 24 in such a manner that part of the upper portion of the substrate group 2 is at least exposed above the liquid level of the de-ionized water in the water bath 21 and also controls the valve member 33 to open and start a high speed drainage of the processed liquid from the water bath 21 after the substrate group 2 is set at the intermediate position B. Accordingly, the physical force exerted to the substrates to tilt and adhere the substrates acts upon the lower portion of the substrate group 2 that is submerged in the processed liquid, thus weakening the physical force as a whole. Thereby, even if the interval of holding the substrates is narrowed as much as the half pitch, merely lifting the substrate group 2 during the high speed drainage can prevent the substrates from being tilted and resultantly adhered to each other without providing a substrate guide in the water bath 21 as proposed in the prior art technology.

[Second Embodiment]

Next, a second embodiment of this invention is described with reference to FIGS. 8 to 10.

Figure 8:
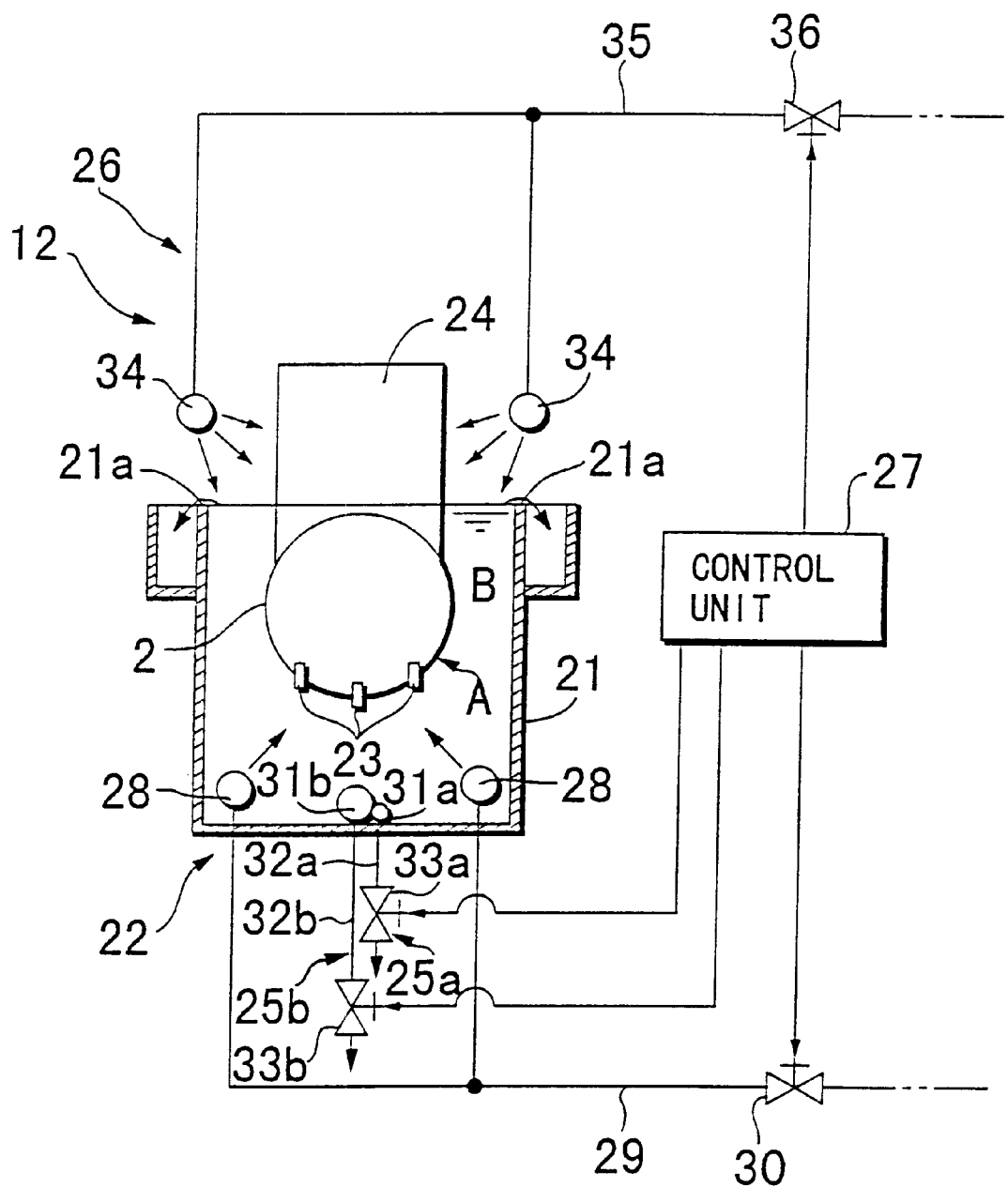
FIG. 8 is a schematic diagram showing a construction of a second mechanical rinsing section.

FIG. 8 is a diagram showing a schematic construction of the mechanical rinsing section embodying the substrate treating apparatus of this invention as a second embodiment. The second embodiment is similar to the first embodiment except the construction and the control operation of draining the processed liquid from the water bath 21. Specifically, the construction of a water bath 21, a de-ionized water supply unit 22, a lifter 24, and a shower unit 26 of the second embodiment is the same as those of the first embodiment, and accordingly, description thereof is omitted herein, and the elements in this embodiment that are identical to those in the first embodiment are denoted at the same reference numerals.

A mechanical rinsing section 12 of the second embodiment is provided with a first drainage unit 25a and a second drainage unit 25b for draining the processed liquid from the water bath 21. The first drainage unit 25a drains the processed liquid produced as a result of the mechanical rinsing treatment in the water bath 21 (a solution mixed with de-ionized water and phosphoric acid in this embodiment) at a slow speed (first speed) from the water bath 21. The second drainage unit 25b drains the processed liquid at a high speed (second speed) faster than the first speed.

As shown in FIG. 8, the first drainage unit 25a includes a drainage port 31a, a plumbing member 32a, and a valve member 33a. The drainage port 31a is formed in a lowermost portion of a side wall of the water bath 21 opposing to the surface of the substrate group 2 immersed in the de-ionized water and has a small cross section to drain the processed liquid at the slow speed. The plumbing member 32a is connected to the drainage port 31a to draw out the processed liquid from the water bath 21. The valve member 33a is arranged on the way of the plumbing member 32a for fluid rate adjustment.

With this arrangement, when performing the slow speed drainage, the valve member 33a is opened to flow the processed liquid at such a speed slower than the high speed as to prevent the substrates from being tilted and adhered to each other at the upper portion thereof. When immersing the substrate group 2 and allowing the water bath 21 to an overflow state, the valve member 33a is closed to wash away the chemical liquid and the particles adhered to the substrate group 2.

Similar to the first drainage unit 25a, the second drainage unit 25b includes a drainage port 31b, a plumbing member 32b, and a valve member 33b. The drainage port 31b is formed in a lowermost portion of a side wall of the water bath 21 opposing to the surface of the substrate group 2 immersed in the de-ionized water and has a cross section larger than the cross section of the drainage port 31a for draining the processed liquid at a high speed. The plumbing member 32b is connected to the drainage port 31b to draw out the processed liquid from the water bath 21. The valve member 33b is arranged on the way of the plumbing member 32b for fluid rate adjustment.

With this arrangement, when performing the high speed drainage, the valve member 33b is opened to drain the processed liquid at the high speed in a short time. When immersing the substrate group 2 and allowing the water bath 21 to an overflow state, the valve member 33b is closed to wash away the chemical liquid and the particles adhered to the substrate group 2.

The control unit 27 comprises, similar to the first embodiment, a sequencer and a microcomputer. Opening/closing the valve members 30, 33a, 33b, 36 in response to a control signal from the sequencer and the microcomputer allows the first drainage unit 25a to drain the processed liquid at the slow speed until part of the upper portion of the substrate group 2 is exposed above the liquid level of the de-ionized water in the water bath 21 (i.e., the liquid level is lowered to a high speed drainage start level). After the liquid level is lowered to the high speed drainage start level, the second drainage unit 25b is controlled to drain the processed liquid at the high speed to accelerate lowering of the liquid level from the high speed drainage start level.

In this way, in the second embodiment, the control unit 27 controls the first drainage unit 25a to set a relative positional relationship between the substrate group 2 and the liquid level of the processed liquid until the liquid level reaches the high speed drainage start level. This control is executed similarly in a fourth embodiment which is described in a later section.

More specifically, the control unit 27 is connected to respective electromagnetic valve control terminals of the valve members 30, 33a, 33b to control the electromagnetic valve control terminal of the valve member 30 to close the valve member 30 so as to suspend supply of de-ionized water, control the electromagnetic valve control terminal of the valve member 33a so as to open the valve member 33a to expose part of the upper portion of the substrate group 2 above the liquid level until the liquid level is lowered to the high speed drainage start level, and then control the electromagnetic valve control terminal of the valve member 33b to open the valve member 33b so as to initiate the high speed drainage.

The control unit 27 is also connected to an electromagnetic valve control terminal of the valve member 36 to open the valve member 36 so as to allow the shower unit 26 to shower de-ionized water onto the substrate group 2 lest the upper end of the substrate group 2 above the liquid level be exposed to the air.

A manner of draining the processed liquid at the low speed while exposing the upper portion of the substrate group 2 so as not to tilt and adhere the upper portion of the substrates depends on the arrayed direction of the substrates, the pitch of the arrayed substrates, and other conditions. For instance, the smaller the pitch is, the more the drainage speed is required to be lowered. It should be noted here in this embodiment that the slow speed (first speed) is a rate set slower than the fastest possible drainage speed that enables prevention of tilt of the upper ends of the substrates and adhesions to each other when draining the processed liquid in a state that the upper end of the substrate group 2 is under the treating liquid. The high speed is a rate set slower than the fastest possible drainage speed that enables prevention of the tilt of the uppermost end of the substrates and adhesion to each other when draining the processed liquid after the liquid level has reached the high speed drainage start level (that is, the upper portion of the substrate group 2 is exposed above the liquid level) It should also be noted that the timing of drainage speed change from the first speed to the second speed may be set to occur when the liquid level has reached the uppermost end of the substrate or when the liquid level has reached a certain distance lower than the uppermost end of the substrate. Herein, the certain distance may be varied such as a value 20% of the diameter of the substrate but not limited thereto, depending upon the designer's choice.

Next, an operation of the mechanical rinsing section 12 having the above construction is described with reference to FIGS. 9A to 10. It should be noted that an operation before and after the mechanical rinsing operation is the same as the first embodiment, and accordingly, description thereof is omitted herein.

Figure 9A:
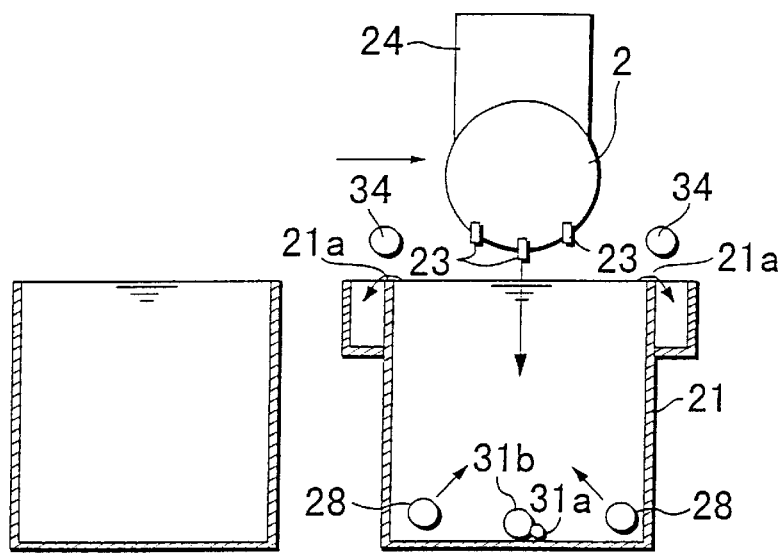
FIGS. 9A to 9E are diagrams showing a sequence of operations in the second mechanical rinsing section.
Figure 9B:
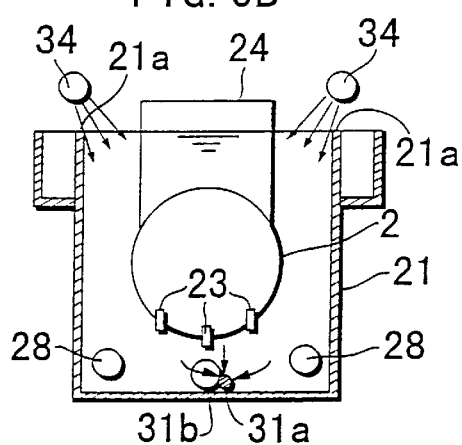
Figure 9C:
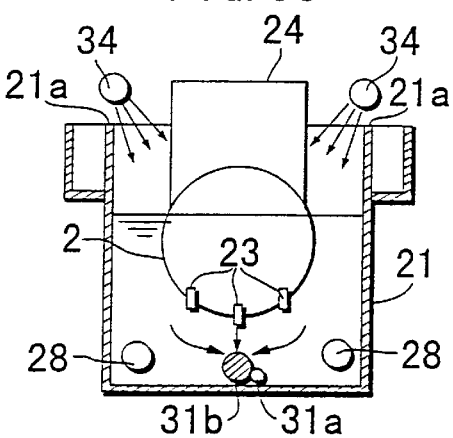
Figure 9D:
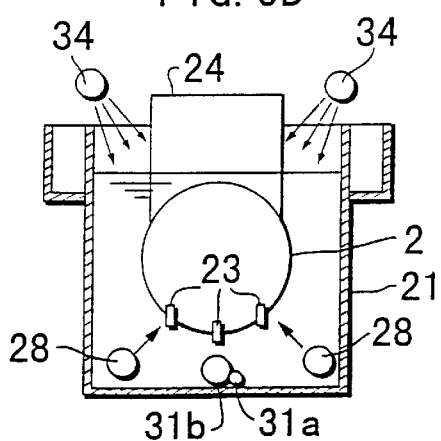
Figure 9E:
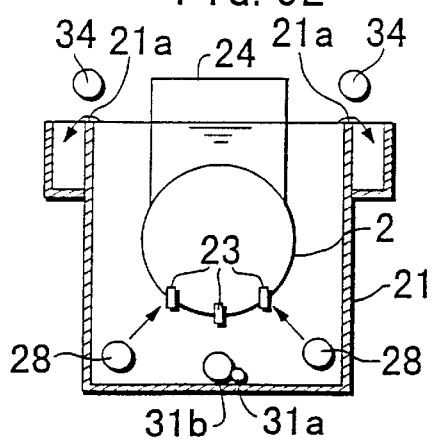
Figure 10:
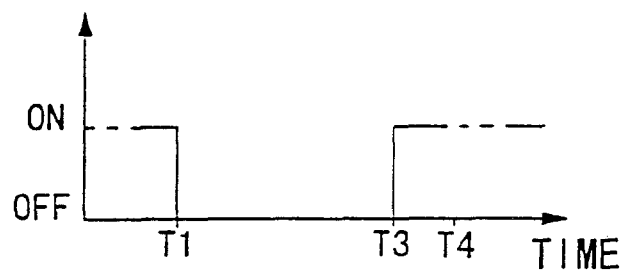
FIG. 10 is a timing chart of the operations of the second mechanical rinsing section.
Figure 10:
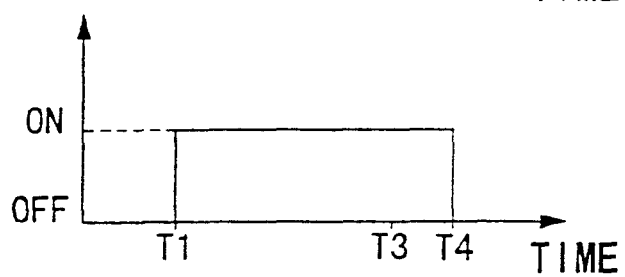
Figure 10:
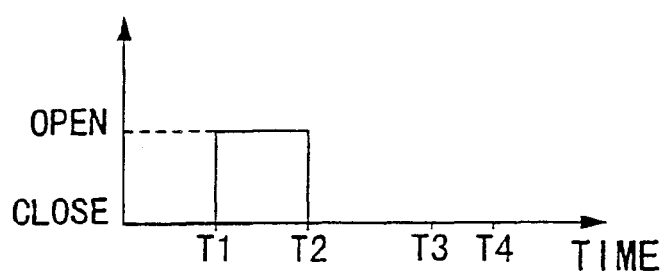
Figure 10:
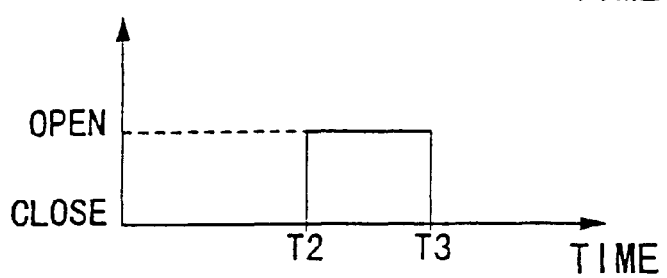

FIGS. 9A to 9E are diagrams showing a sequence of the operations in the mechanical rinsing section 12. FIG. 9A shows a state that a substrate group 2 applied with a chemical liquid is about to be immersed in the de-ionized water in the water bath 21. FIG. 9B shows a state that the substrate group 2 has been immersed in the de-ionized water in the water bath 21, and the water bath 21 is resultantly brought to an overflow state. FIG. 9C shows a state that a high speed drainage is performed with continuation of a shower. FIG. 9D shows a state that the high speed drainage is suspended and the water bath 21 is being replenished with de-ionized water with continuation of the shower. FIG. 9E shows a state that the water bath 21 is brought to an overflow state again.

As shown in FIG. 9A, the substrate group 2 having been applied with the chemical treatment in the second phosphoric acid treating section 11 is transferred to the mechanical rinsing section 12 by a transport robot (not shown) and held by the lifter 24. The lifter 24 carrying the substrate group 2 in a state that each substrate is supported at the three lower portions thereof in an upright posture in the groove of the support guide 23 at a specified interval is immersed in the de-ionized water in the water bath 21. At this time, the control unit 27 controls the electromagnetic valve control terminal of the valve member 30 to set the valve member 30 in an opened state and controls the respective electromagnetic valve control terminals of the valve members 33a, 33b to set the valve members 33a, 33b in an closed state. While opening the valve member 30 and closing the valve members 33a, 33b, de-ionized water is replenished in the water bath 21 through the nozzles (not shown) of the tubular members 28 of the water supply unit 22 in such a manner that the water is ejected toward the substrate group 2 immersed in the de-ionized water. As a result, the de-ionized water overflows from the upper rim 21a of the water bath 21 to wash away the chemical liquid and the particles adhered to the surface of the substrate group 2 from the water bath 21 along with the de-ionized water (treating process).

The control unit 27 keeps opening the valve member 30 and closing the valve members 33a, 33b for a predetermined time to continue overflow of the de-ionized water from the water bath 21. Thereafter, in the case where the surface of the substrate group 2 exhibits a hydrophillic state, as shown in FIG. 9B, the control unit 27 controls the electromagnetic valve control terminal of the valve member 30 to close the valve member 30 to suspend supply of de-ionized water through the tubular members 28. Further, at this time, the valve member 33a is opened to drain the processed liquid through the drainage port 31a at the slow speed (first speed) (position adjusting process).

As an altered arrangement, there is an idea that the valve member 36 of the shower unit 26 may be opened prior to exposure of the upper portion of the substrate group 2 above the liquid level. In this embodiment, however, the valve member 36 is opened at a start of the low speed drainage through the drainage port 31a, to shower de-ionized water onto the upper portion of the surface of the substrate group 2 through the nozzles (not shown) of the tubular members 34 of the shower unit 26, thereby preventing the surface of the substrate group 2 from being exposed to the air.

At this time (at the timing T1 in FIG. 10), the control unit 27 opens the valve member 33a to drain the processed liquid at the low speed through the drainage port 31a and opens the valve member 36 to allow de-ionized water to be showered onto the substrate group 2, and closes the valve member 30 to suspend supply of de-ionized water through the tubular members 28.

After lowering of the liquid level of the de-ionized water in the water bath 21 to the high speed drainage start level (see the timing T2 in FIG. 10), as shown in FIG. 9C, the control unit 27 controls the electromagnetic valve control terminal of the valve member 33a to close the valve member 33a so as to suspend drainage through the drainage port 31a, and also controls the electromagnetic valve control terminal of the valve member 33b to open the valve member 33b so as to drain the processed liquid at the high speed (second speed) through the drainage port 31b (high speed draining process).

At this time (at the timing T2 in FIG. 10), the valve member 33a is closed, and the valve member 33b is opened. Further, at the timing T2, the valve member 30 is kept at the closed state and supply of de-ionized water through the tubular members 28 is suspended.

When the liquid level is lowered to such a level as to expose the upper portion of the substrate group 2, the drainage speed is changed from the low speed to the high speed. In-this embodiment, when the upper 40 mm (exposure ratio 20% relative to the diameter of the substrate when the substrate having 200 mm diameter is used) is exposed above the liquid level, the drainage speed is changed. Changeover of the drainage speed under the above condition prevented the substrates from being tilted and adhered to each other accompanied by lowering of the liquid level due to the low speed drainage and the high speed drainage and resultantly prevented damage of the surface of the substrates.

More specifically, the more the exposed part of the substrate group 2 above the liquid level is during the high speed drainage, the better the damage of the substrates can be prevented. In other words, lowering the liquid level relative to the substrate group 2 securely reduces the possibility of tilting and adhesion of the substrates. Accordingly, the exposure ratio of the substrates above the liquid level is determined, based on an experiment, in such a manner that the substrates are prevented from being tilted and adhered to each other during the high speed drainage, depending on the pitch of the arrayed substrates, the material and the thickness of the substrate, and the held state by the lifter 24.

After the high speed drainage (see the timing T3 in FIG. 10), the control unit 27 controls, as shown in FIG. 9D, the electromagnetic valve control terminal of the valve member 30 to open the valve member 30, while keeping the valve member 36 of the shower unit 26 in the ON-state to replenish the water bath 21 with de-ionized water to such a level as to immerse the entirety of the substrate group 2 in the de-ionized water in the water bath 21. At this time, the valve member 33b is closed to suspend the high speed drainage through the drainage port 31b, and at the same time, the valve member 30 is opened to start supply of de-ionized water through the tubular members 28.

In this construction, the lifter 24 is controllably lowered along with the substrate group 2 in accordance with lowering of the liquid level accompanied by the drainage so as to lessen a physical load to the substrate group 2 accompanied by the drainage. Also, the time required for drainage is shortened by increasing the drainage speed.

The shower unit 26 (the valve member 36) is kept in the ON-state until the timing T4 to immerse the substrate group 2 in sufficient de-ionized water. In other words, controlling the shower unit 26 in an ON-state to such a manner as to submerge the upper end of the substrate group 2 in the de-ionized water securely immerses the substrate group 2 in the de-ionized water.

Thereafter, as shown in FIG. 9E, supply of de-ionized water through the nozzles of the tubular member 28 is continued. Thereby, the water bath 21 is brought to an overflow state again to wash away the chemical liquid and the particles adhered to the substrate group 2 along with the overflowing water.

Similar to the operation in the first embodiment, the control unit 27 controls the valve members 30, 33a, 33b, 36 to repeat the above sequence again. Specifically, immersing the substrate group 2 and allowing the water bath 21 to an overflow state, suspending the overflow and starting low speed drainage while actuating the shower unit 26, starting high speed drainage, replenishment of de-ionized water followed by turn off of the shower unit 26, and allowing the water bath 21 to an overflow state again are cyclically repeated for a predetermined number of times. Thereby, the chemical liquid and the particles adhered to the surface of the substrate group 2 are quickly removed, and thus the mechanical rinsing operation in the mechanical rinsing section 12 to prevent an adverse affect of the chemical liquid and the particles adhered to the substrates is finalized.

As mentioned above, each substrate of the substrate group 2 is supported by the support guide 23 in a fitted state in the groove. As described in the Prior Art section, it is highly likely that the upper portion of the substrates is tilted and adhered to each other accompanied by a drastic lowering of the liquid level during a high speed drainage of the processed liquid. In other words, the upper portion of the substrates is subject to an influence of a change of water flow and resultantly may be adhered to each other.

However, in this embodiment, the control unit 27 controls the first drainage unit 25a to open the valve member 33a at the timing T1 to drain the processed liquid through the drainage port 31a at the low speed so as to first expose at least the upper portion of the substrate group 2 above the liquid level in the water bath 21, and then controls the second drainage unit 25b to open the valve member 33b at the timing T2 to start the high speed drainage through the drainage port 31b. Accordingly, the physical force to tilt and adhere the substrates acts upon the lower portion of the substrate group 2 that is submerged in the processed liquid, thus weakening the force as a whole. Thereby, even if the interval of holding the substrates is narrowed as much as the half pitch, the substrates are prevented from being tilted and resultantly adhering to each other without providing a substrate guide in the water bath 21 as proposed in the prior art technology.

Further, the physical force is weakened by the simple construction and the control operations of the control unit 27 that the drainage speed is changed by selectively controlling the first drainage unit 25a and the second drainage unit 25b.

In the second embodiment, the drainage system of the mechanical rinsing section 12 comprises the first drainage unit 25a that enables the low speed drainage and the second drainage unit 25b that enables the high speed drainage. The control unit 27 controls the first drainage unit 25a to perform the low speed drainage for the predetermined period until the upper portion of the substrate group 2 is exposed above the liquid level (the liquid level reaches the high speed drainage start level) and changeovers the drainage from the first drainage unit 25a to the second drainage unit 25b after the high speed drainage start level.

Alternatively, the drainage system may comprise a first drainage section and a second drainage section to change the drainage between a low speed drainage performed by the first drainage section and a high speed drainage performed by the first drainage section and the second drainage section. In the altered arrangement, the drainage performance (drainage speed) with the use of the first drainage section may be the same as that with the use of the second drainage section. Further, the number of the drainage sections is not limited to two, but may be more than two.

The drainage performance may be set stepwise in place of the dual step. In such a case, the drainage system may be provided with plural drainage devices to selectively drive the drainage devices so as to effect the drainage stepwise.

Further, gradually increasing the first speed (low speed) in accordance with lowering of the liquid level to such an extent as to prevent the substrates from being tilted and adhered to each other may accelerate lowering of the liquid level to the high speed drainage start level so as to efficiently drain the processed liquid. Thereby, time required for drainage is shortened.

[Third Embodiment]

A third embodiment of this invention is described with reference to FIG. 11. In the second embodiment, the first drainage unit 25a and the second drainage unit 25b are selectively controlled to change the drainage manner. In the third embodiment, a variable speed setter capable of altering the drainage speed stepwise is used. To simplify the description of the third embodiment, exemplified is a dual speed setter capable of altering the drainage speed at two stages. Similar to the second embodiment, elements in this embodiment that are identical to those in the first embodiment in the aspect of operation and effect are denoted at the same reference numerals. Further, it should be noted that the operation before and after the mechanical rinsing operation in this embodiment is the same as the first embodiment, and accordingly, description thereof is omitted herein.

Figure 11:
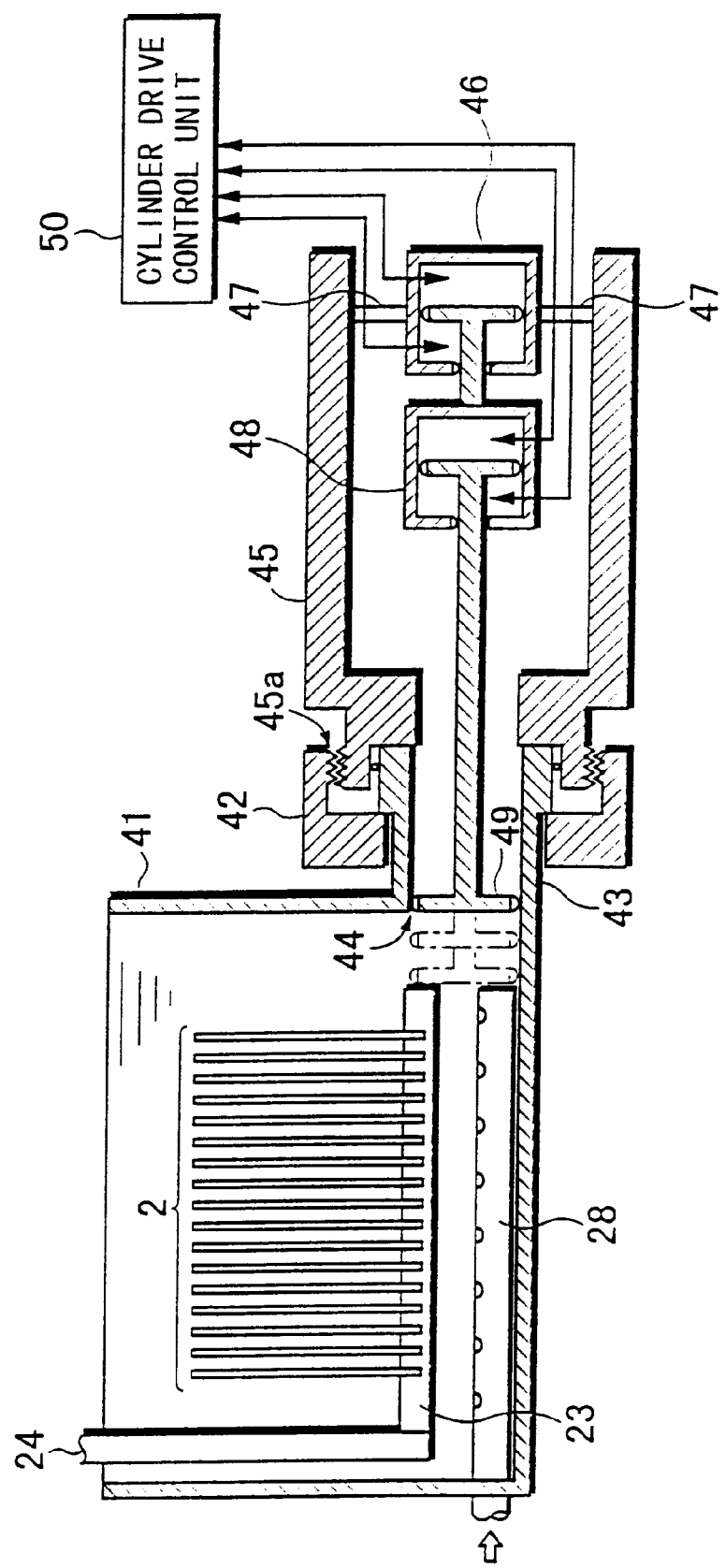
FIG. 11 is a schematic diagram showing part of a third mechanical rinsing section.

FIG. 11 is a schematic cross sectional diagram showing part of the mechanical rinsing section as the third embodiment. The element corresponding to the variable speed setter is enlargedly illustrated compared to the other elements to clarify the construction of the variable speed setter. As shown in FIG. 11, a water bath 41 is formed with a drainage port 44 in a bottom portion of a side wall thereof. A nut member 42 and a tubular member 43 are provided near the drainage port 44, and the nut member 42, the tubular member 43, and the drainage port 44 constitute a drainage system. A high speed drainage valve main body 45 as the variable speed setter is mounted to the nut member 42 and the tubular member 43 in such a manner that an end of the valve main body 45 is abutted against an end of the tubular member 43 and an internal threaded portion of the nut member 42 is engaged with an external threaded portion 45a of the valve main body 45.

A first cylinder 46 is fixedly mounted to an inner wall of one end of the valve main body 45 by a fixed member 47. A second cylinder 48 is serially and fixedly connected to the first cylinder 46 inside the valve main body 45 via a rod of the first cylinder 46. A valve member 49 is provided at a lead end of a rod of the second cylinder 48. When the drainage port 44 is closed by the valve member 49, an inner bottom surface of the water bath 41 as a whole is made flat to prevent turbulence of water flow. A drive source of the first cylinder 46 and the second cylinder 48 may be a hydraulic pressure supplier or a pneumatic pressure supplier. A cylinder drive control unit 50 as a controller is provided to control the hydraulic/pneumatic pressure supplier to expand and retract the rod of the first cylinder 46 and the second cylinder 48. The cylinder drive control unit 50 is connected to the first cylinder 46 and the second cylinder 48 via a pipe.

Controlling the rod of the first cylinder 46 and the second cylinder 48 actuates the valve member 49 to open and close the drainage port 44 for fluid rate adjustment. Expanding the rod of the first cylinder 46 and the second cylinder 48 (see the valve member 49 shown by the leftmost phantom line in FIG. 11) opens the drainage port 44 and accordingly sets the drainage speed at a high speed (second speed), and retracting the rod of the first cylinder 46 and the second cylinder 48 (see the valve member shown by the solid line in FIG. 11) closes the drainage port 44. Further, retracting the rod of the first cylinder 46 (or the second cylinder 48) while retaining expansion of the rod of the second cylinder 48 (or the first cylinder 46) (see the valve member 49 shown by the right phantom line in FIG. 11) sets the drainage speed at a low speed (first speed) slower than the high speed.

In this way, the high speed drainage valve main body 45 constitutes the variable speed setter capable of altering the drainage speed stepwise (in this embodiment, at two stages). The cylinder drive control unit 50 controls the first cylinder 46 and the second cylinder 48 to set the drainage speed at two stages. Specifically, expanding the rod of the first cylinder 46 (or the second cylinder 48) while the upper end of the substrate group 2 is exposed above the liquid level of de-ionized water in the water bath 41 sets a clearance defined between the drainage port 44 and the valve member 49 small to drain the processed liquid at the low speed until the liquid level is lowered to the high speed drainage start level. Thereby, certain part of the upper portion of the substrate group 2 is exposed above the liquid level. Thereafter, expanding the rod of the second cylinder 48 (or the first cylinder 46) widens the clearance between the drainage port 44 and the valve member 49 to drain the processed liquid at the high speed.

As mentioned above, in the third embodiment, the high speed drainage valve main body 45 as the variable speed setter is used, in place of the arrangement of the second embodiment of providing the first drainage unit 25a and the second drainage unit 25b. Thereby, in addition to the effect of the second embodiment of avoiding an adhesion of the substrates, this embodiment is advantageous in reducing the number of parts of the substrate treating apparatus. Further, although not illustrated in the drawing, providing the variable speed setter capable of varying the drainage speed stepwise and raising the drainage speed in accordance with lowering of the liquid level to such an extent as not to adhere the substrates accelerate the lowering of the liquid level to the high speed drainage start level, thereby improving the drainage performance and reducing the time required for drainage.

In this embodiment, the drainage port 44 and the high speed drainage valve main body 45 are provided in the bottom portion of the side wall of the water bath 41. As an altered form, the drainage port 44 and the high speed drainage valve main body 45 may be provided at a bottom wall of the water bath 41.

In this embodiment, the valve member 49 is directly and fixedly connected to the rod of the first cylinder 46 and the second cylinder 48. Alternatively, in the case where the variable speed setter is provided at the bottom wall of the water bath 41, the rod of the first cylinder 46 may be connected to a first valve member via a crank arm to open the drainage port 44 wide and the rod of the second cylinder 48 may be connected to a second valve member via a second crank arm to open the drainage port 44 small.

[Fourth Embodiment]

Next, a fourth embodiment is described with reference to FIGS. 12 and 13. In the third embodiment, expanding and retracting the rod of the first cylinder 46 and the second cylinder 48 changes the clearance between the drainage port 44 and the valve member 49 stepwise (in the embodiment, two stages). In this embodiment, a construction comprising a motor and a rotary valve member is used, in place of the arrangement of the third embodiment of providing the first cylinder 46, the second cylinder 48, and the valve member 49. To simplify the description of the fourth embodiment, a dual speed setter is described as an example of the variable speed setter. Elements in this embodiment that are identical to those in the first embodiment in the aspect of operation and effect are denoted at the same reference numerals. Further, it should be noted that the operation before and after the mechanical rinsing operation in this embodiment is the same as the first embodiment, and accordingly, description thereof is omitted herein.

Figure 12:
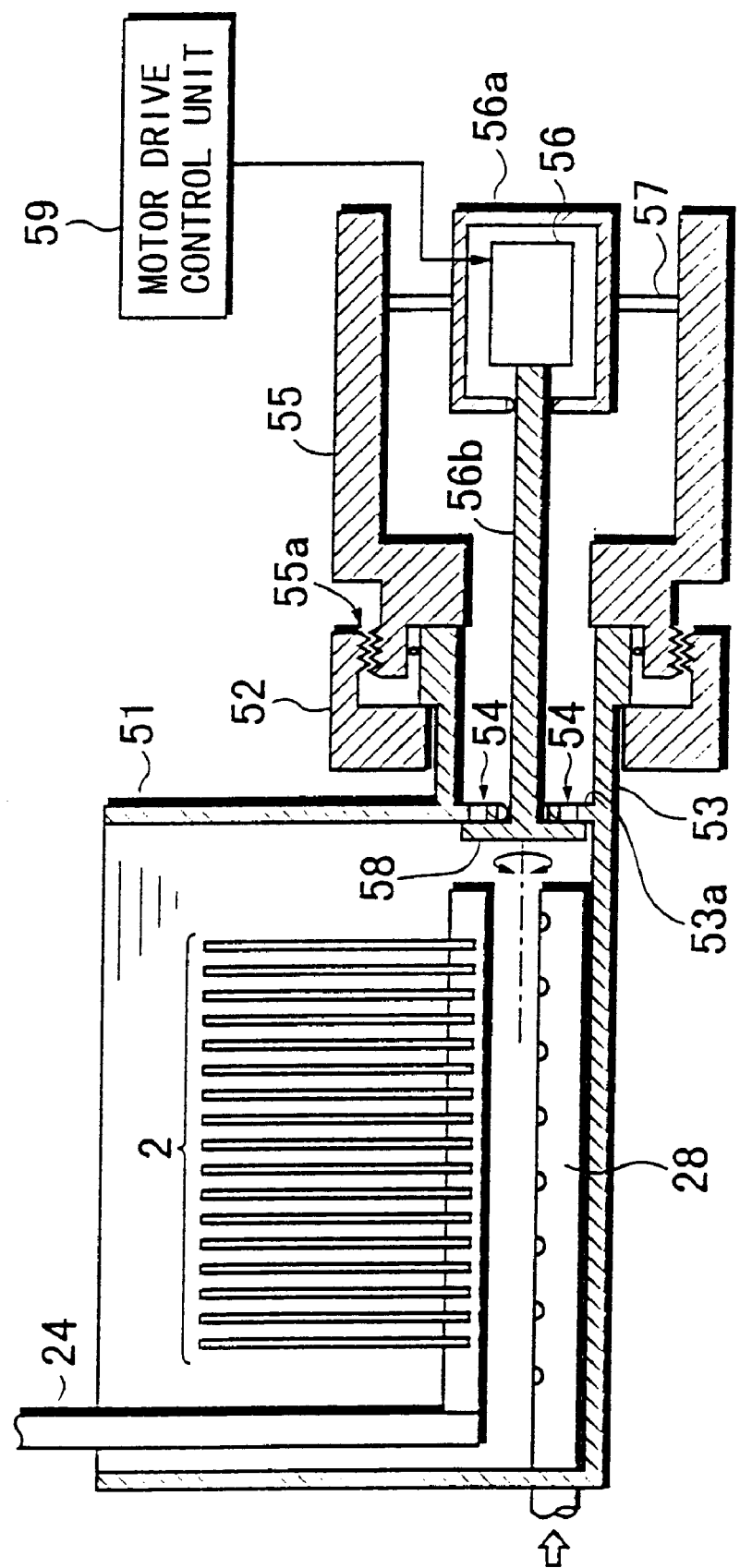
FIG. 12 is a schematic diagram showing part of a fourth mechanical rinsing section.

FIG. 12 is a schematic cross sectional diagram showing part of the mechanical rinsing section-as the fourth embodiment. The element corresponding to the variable speed setter is enlargedly illustrated compared to the other elements to clarify the construction of the variable speed setter. FIG. 13 is a plan view of a rotary valve member.

As shown in FIG. 12, a bottom portion of a side wall of a water bath 51 is formed with a drainage port 54 mounted with a rotary valve member 58 which is described later. A nut member 52 and a tubular member 53 are provided near the drainage port 54, and the nut member 52, the tubular member 53, and the drainage port 54 constitute a drainage system. A high speed drainage valve main body 55 as the variable speed setter is mounted to the nut member 52 and the tubular member 53 in such a manner that an end of the valve main body 55 is abutted against an end of the tubular member 53 and an internal threaded portion of the nut member 52 is engaged with an external threaded portion 55a of the valve main body 55.

A motor 56 is fixedly mounted to an inner wall of one end of the valve main body 55 by a fixed member 57 in a state that the motor 56 is shielded by a waterproof cover 56a. A lead end of a rotary shaft 56b of the motor 56 is fixed to a center of a rotary valve member 58. With this arrangement, a driving force of the motor 56 is transmitted to the rotary valve member 58 via the rotary shaft 56b so as to rotate the rotary valve member 58.

Figure 13:
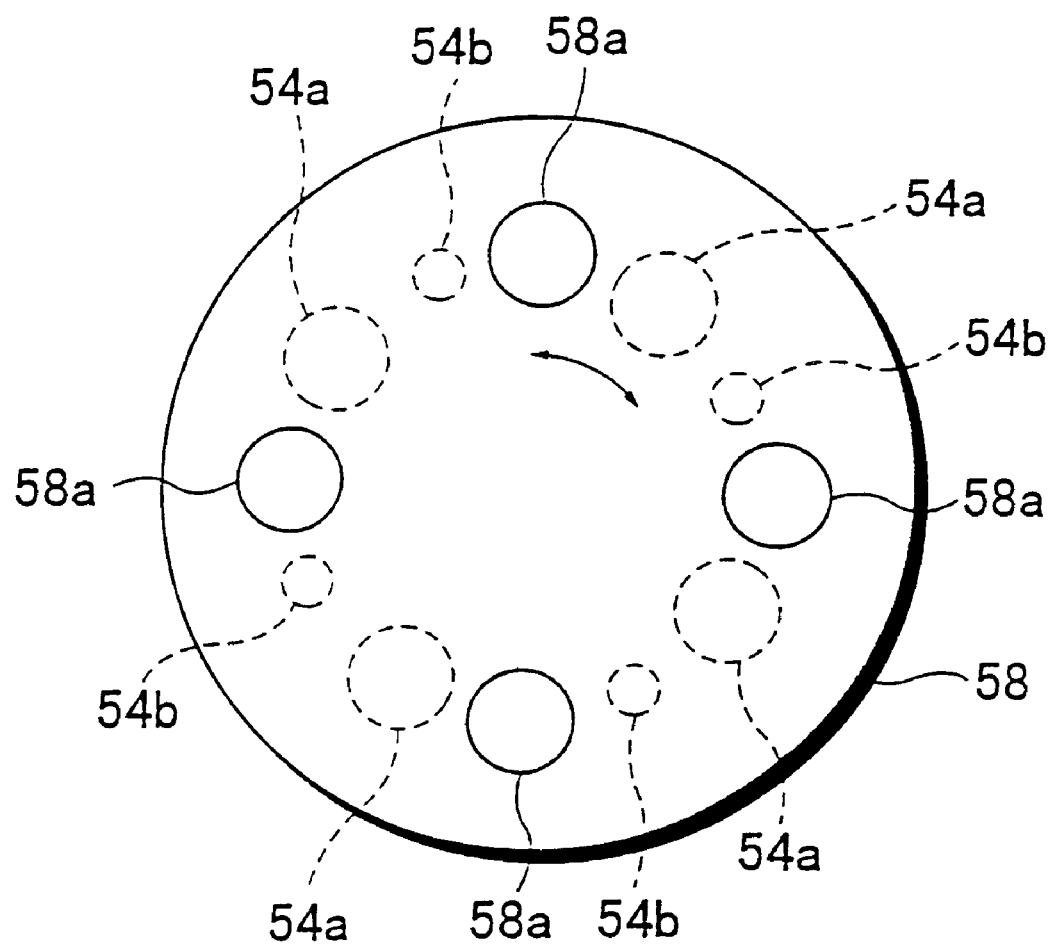
FIG. 13 is a plan view of a rotary valve member in the fourth mechanical rinsing section.

As shown by the dotted circle in FIG. 13, four large diametrical holes 54a and four small diametrical hole 54b are formed in a flange member 53a (see FIG. 12) to reduce the inner diameter of the tubular member 53 in such a manner that the large diametrical hole 54a and the small diametrical hole 54b are arranged alternately and symmetrically with respect to the center of the flange member 53a. The large diametrical holes 54a and the small diametrical holes 54b constitute the drainage port 54. The rotary valve member 58 overlies the flange member 53a to be rotatable relative thereto. Four large diametrical holes 58a shown by the solid circle and having the same diameter as the large diametrical hole 54a are formed in the rotary valve member 58 at a position corresponding to the large diametrical hole 54a.

With this arrangement, when the rotary valve member 58 is rotated to such a position as to match the holes 58a with the large diametrical holes 54a of the flange member 53a, the variable speed setter is enabled to set the drainage speed at the high speed. On the other hand, when the rotary valve member 58 is rotated to such a position as to match the holes 58a with the small diametrical holes 54b of the flange member 53a, the variable speed setter is enabled to set the drainage speed at the low speed. Further, when the holes 58a of the rotary valve member 58 do not coincide with the large diametrical holes 54a (or the small diametrical holes 54b), the drainage port 54 is set to a closed state.

The rotary valve member 58 is pressed against the flange member 53a by the water pressure of the processed liquid in the water bath 51, thus rendering the water bath 51 in a watertight state. A motor drive control unit 59 as a controller is provided to rotate the motor 56. The motor drive control unit 59 is connected to the motor 56 via a signal line and a power line.

The motor drive control unit 59 controls the motor 56 to set the angular position of the rotary valve member 58. Thereby, the fluid rate of draining the processed liquid and the timing of suspending the drainage are controlled by selectively setting the position of the holes 58a of the rotary valve member 58 relative to the large diametrical holes 54a (or the small diametrical holes 54b).

As mentioned above, the high speed drainage valve main body 55 constitutes the variable speed setter (dual speed setter in this embodiment). The motor drive control unit 59 controls the motor 56 to changeover the drainage speed at two stages. More specifically, controlling the motor 56 to set the angular position of the rotary valve member 58 such that the holes 58a of the rotary valve member 58 coincide with the small diametrical holes 54b of the drainage port 54 reduces the port area. Thereby, the processed liquid in the water bath 51 is drained at the low speed until the liquid level is lowered to the high speed drainage start level, and a certain part of the upper portion of the substrate group 2 is exposed above the liquid level. Thereafter, controlling the motor 56 to set the angular position of the rotary valve member 58 such that the holes 58a of the rotary valve member 58 coincide with the large diametrical holes 54a widens the port area. Thereby, the processed liquid is drained at the high speed.

In this embodiment, the high speed drainage valve main body 55 is provided as a variable speed setter, in place of the construction of the second embodiment of providing the first drainage unit 25a and the second drainage unit 25b. This arrangement reduces the number of parts of the substrate treating apparatus in addition to the effect attained in the second embodiment of avoiding an adhesion of the substrates.

Further, although not illustrated in the drawing, providing the variable speed setter capable of varying the drainage speed stepwise and raising the drainage speed in accordance with lowering of the liquid level to such an extent as not to adhere the substrates accelerate the lowering of the liquid level to the high speed drainage start level, thereby improving the drainage performance and reducing the time required for drainage.

The drainage-port 54 and the high speed drainage valve main body 55 are provided in a bottom portion of a side wall of the water bath 51 in this embodiment. Alternatively, the drainage port 54 and the high speed drainage valve main body 55 may be provided in a bottom wall of the water bath 51.

[Modification]

Throughout the second to the fourth embodiments, the substrate treating apparatus according to this invention is constructed in such a manner as to keep draining the processed liquid at the low speed from drainage start where the upper end of the substrate group is immersed in the processed liquid to the lowering of the liquid level to the high speed drainage start level. As a modified construction, setting the drainage speed at a higher speed faster than the low speed from the drainage start until the upper end of the substrate group comes out of the processed liquid further shortens the drainage time. Note that the higher speed (also referred to as a high drainage speed) in this context should be understood that draining process at this higher speed does not tilt the uppermost ends of the substrates immersed in the treating liquid to make contact with each other but this higher speed is yet faster than the low speed.

In the foregoing embodiments, the wet station 1 incorporated with the substrate treating apparatus embodying the present invention is described in such a manner that a plurality of baths are provided in the processing unit 7. Namely, this substrate treating apparatus is a multi-bath substrate treating apparatus. However, a specific construction of the wet station may be other than the one mentioned above unless otherwise change and modifications depart from the scope of the invention. For instance, the above wet station incorporated with the mechanical rinsing section is also applicable to a single bath substrate treating apparatus.

The mechanical rinsing section 12 of the wet station 1 is described as the substrate treating apparatus embodying this invention in the aforementioned embodiments. As a modification, this invention may be applicable to the phosphoric acid treating section 10 (11) when replacing the chemical liquid (phosphoric acid solution) in the treating bath with a new one.

Further, in the embodiments, the nitride film removal process is described as an example of the series of chemical treatments in the processing unit 7. As a modification, the chemical treatment may be photoresist film peeling off process, oxide film etching, light etching, or cleaning prior to diffusion.

As mentioned above, this invention is applicable to a single bath substrate treating apparatus in which various surface treatments including the mechanical rinsing operation are performed in a single bath. Namely, this invention is not limited to the mechanical rinsing section 12 but applicable to any substrate treating apparatus in which a substrate is immersed in a treating liquid such as a chemical liquid and de-ionized water to apply a certain treatment.

In the foregoing embodiments, while the upper portion of the substrate group 2 is exposed above the liquid level of processed liquid in the water bath prior to a high speed drainage, the shower unit is operated to shower de-ionized water onto the upper portion of the surface of the substrate group 2. Nitrogen purging may be applied in place of the operation of the shower unit.

Although the present invention has been fully described by way of example with reference to the accompanying drawings, it is to be understood that various changes and modifications will be apparent to those skilled in the art. Therefore, unless otherwise such change and modifications depart from the scope of the invention, they should be construed as being included therein.

What is claimed is:

1. A substrate treating apparatus in which substrates are to be immersed in a treating bath filled with a treating liquid to apply a certain treatment to the substrates, the apparatus comprising:

a drainage system for draining the treating liquid from the treating bath; and a controller for setting a relative positional relationship between the substrates and the liquid level of the treating liquid such that part of the substrates are exposed above the liquid level of the treating liquid before initiation of a high speed drainage by the drainage system.

2. The substrate treating apparatus as defined in claim 1, further comprising a lifter for moving the substrates up and down relative to the treating bath, the controller controlling the lifter to expose at least the part of the substrates above the liquid level of the treating liquid prior to the high speed drainage by the drainage system.

3. A substrate treating apparatus comprising:

a treating bath for being filled with a treating liquid;

a lifter for moving substrates up and down relative to the treating bath;

a drainage system for draining the treating liquid from the treating bath; and a controller for controlling at least one of the lifter and the drainage system to set a relative positional relationship between the substrates and the liquid level of the treating liquid such that part of the substrates are exposed above the liquid level of the treating liquid before initiation of a high speed drainage by the drainage system.

4. A substrate treating apparatus in which substrates are to be immersed in a treating bath filled with a treating liquid to apply a certain treatment to the substrates, the apparatus comprising:

a drainage system for draining the treating liquid from the treating bath; and a controller for setting a relative positional relationship between the substrates and the liquid level of the treating liquid such that part of the substrates are exposed above the liquid level of the treating liquid before initiation of a high speed drainage by the drainage system, wherein the drainage system variably sets a drainage speed of the treating liquid, and the controller controls the drainage system to drain the treating liquid at a first speed until the liquid level of the treating liquid is lowered to a high speed drainage start level where the liquid level is within a range between an uppermost end and a lowermost end of the substrates, and controls the drainage system to drain the treating liquid at a second speed faster than the first speed after the liquid level has reached the high speed drainage start level.

5. The substrate treating apparatus as defined in claim 4, wherein the drainage system includes a first drainage unit for draining the treating liquid at the first speed and a second drainage unit for draining the treating liquid at the second speed, and the controller controls the first drainage unit and the second drainage unit to change the drainage from the first drainage unit to the second drainage unit when the liquid level of the treating liquid has reached the high speed drainage start level.

6. The substrate treating apparatus as defined in claim 4, wherein the drainage system includes a variable speed setter for setting the drainage speed stepwise, and the controller controls the variable speed setter to raise the drainage speed from the first speed to the second speed when the liquid level of the treating liquid has reached the high speed drainage start level.

7. The substrate treating apparatus as defined in claim 6, wherein the controller controls the drainage system to directly change the drainage speed from the first speed to the second speed.

8. The substrate treating apparatus as defined in claim 6, wherein the drainage system includes a dual speed setter for setting the drainage speed at two stages, and the controller controls the drainage system to change the drainage speed from the first speed to the second speed when the liquid level of the treating liquid has reached the high speed drainage start level.

9. The substrate treating apparatus as defined in claim 6, wherein the drainage system includes a plurality of drainage sections for draining the treating liquid from the treating bath, and the controller controls a first number of drainage sections among the plurality of drainage sections to drain the treating liquid at the first speed until the liquid level of the treating liquid reaches the high speed drainage start level, and controls a second number of drainage sections among the plurality of drainage sections to drain the treating liquid at the second speed after the liquid level has reached the high speed drainage start level, the second number larger than the first number.

10. The substrate treating apparatus as defined in claim 6, wherein the controller controls the drainage system to gradually raise the first speed in accordance with the liquid level of the treating liquid.

11. The substrate treating apparatus as defined in claim 4, wherein the controller controls the drainage system to drain the treating liquid from the treating bath at the second speed until the liquid level of the treating liquid reaches the upper end of the substrates.

12. A substrate treating apparatus comprising:

a treating bath for being filled with a treating liquid;

a lifter for moving substrates up and down relative to the treating bath;

a drainage system for draining the treating liquid from the treating bath; and a controller for controlling at least one of the lifter and the drainage system to set a relative positional relationship between the substrates and the liquid level of the treating liquid such that part of the substrates are exposed above the liquid level of the treating liquid before initiation of a high speed drainage by the drainage system, wherein the drainage system variably sets a drainage speed of the treating liquid, and the controller controls the drainage system to drain the treating liquid at a first speed until the liquid level of the treating liquid is lowered to a high speed drainage start level where the liquid level is within a range between an uppermost end and a lowermost end of the substrates, and controls the drainage system to drain the treating liquid at a second speed faster than the first speed after the liquid level has reached the high speed drainage start level.

13. The substrate treating apparatus as defined in claim 12, wherein the drainage system includes a first drainage unit for draining the treating liquid at the first speed and a second drainage unit for draining the treating liquid at the second speed, and the controller controls the first drainage unit and the second drainage unit to change the drainage from the first drainage unit to the second drainage unit when the liquid level of the treating liquid has reached the high speed drainage start level.

14. The substrate treating apparatus as defined in claim 12, wherein the drainage system includes a variable speed setter for setting the drainage speed stepwise, and the controller controls the variable speed setter to raise the drainage speed from the first speed to the second speed when the liquid level of the treating liquid has reached the high speed drainage start level.

15. The substrate treating apparatus as defined in claim 14, wherein the controller controls the drainage system to directly change the drainage speed from the first speed to the second speed.

16. The substrate treating apparatus as defined in claim 14, wherein the drainage system includes a dual speed setter for setting the drainage speed at two stages, and the controller controls the drainage system to change the drainage speed from the first speed to the second speed when the liquid level of the treating liquid has reached the high speed drainage start level.

17. The substrate treating apparatus as defined in claim 14, wherein the drainage system includes a plurality of drainage sections for draining the treating liquid from the treating bath, and the controller controls a first number of drainage sections among the plurality of drainage sections to drain the treating liquid at the first speed until the liquid level of the treating liquid reaches the high speed drainage start level, and controls a second number of drainage sections among the plurality of drainage sections to drain the treating liquid at the second speed after the liquid level has reached the high speed drainage start level, the second number larger than the first number.

18. The substrate treating apparatus as defined in claim 14, wherein the controller controls the drainage system to gradually raise the first speed in accordance with the liquid level of the treating liquid.

19. The substrate treating apparatus as defined in claim 12, wherein the controller controls the drainage system to drain the treating liquid from the treating bath at the second speed until the liquid level of the treating liquid reaches the upper end of the substrates.

* * * * *